(12) United States Patent
Kobayashi

(10) Patent No.: US 10,879,279 B2
(45) Date of Patent: Dec. 29, 2020

(54) METHOD OF MANUFACTURING DISPLAY, DISPLAY, AND LIQUID CRYSTAL TELEVISION

(71) Applicant: THE JAPAN STEEL WORKS, LTD., Tokyo (JP)

(72) Inventor: Naoyuki Kobayashi, Yokohama (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 46 days.

(21) Appl. No.: 15/954,185

(22) Filed: Apr. 16, 2018

(65) Prior Publication Data
US 2018/0315782 A1   Nov. 1, 2018

(30) Foreign Application Priority Data

Apr. 26, 2017 (JP) .................. 2017-087264

(51) Int. Cl.
*H01L 27/12*         (2006.01)
*H01L 29/786*        (2006.01)
(Continued)

(52) U.S. Cl.
CPC ........ *H01L 27/1296* (2013.01); *G02F 1/1368* (2013.01); *H01L 21/02422* (2013.01); *H01L 21/02488* (2013.01); *H01L 21/02532* (2013.01); *H01L 21/02595* (2013.01); *H01L 21/02678* (2013.01); *H01L 21/02691* (2013.01); *H01L 27/1222* (2013.01); *H01L 27/1285* (2013.01); *H01L 29/66765* (2013.01); *H01L 29/78678* (2013.01); *G02F 2202/104* (2013.01);
(Continued)

(58) Field of Classification Search
CPC ......... H01L 21/02532; H01L 21/02675; H01L 21/02595; H01L 21/02686; H01L 29/04; H01L 29/1604
See application file for complete search history.

(56) References Cited

U.S. PATENT DOCUMENTS 5,145,808 A  *  9/1992  Sameshima ......... H01L 21/2026
                                                   117/44
5,904,550 A  *  5/1999  Yamaguchi ......... H01L 21/2026
                                                   438/487
(Continued)

FOREIGN PATENT DOCUMENTS

JP        4053412 B2    2/2008
JP        4477333 B2    6/2010
(Continued)

*Primary Examiner* — Joseph M Galvin, III
(74) *Attorney, Agent, or Firm* — SGPatents PLLC

(57) ABSTRACT

Provided is a method of manufacturing a display, a display, and a liquid crystal television that can improve productivity and make a grain size uniform. A method of manufacturing a display includes: (A) deriving, when a laser beam is applied to an aSi film 18 provided on a substrate 11 to thereby polycrystallize the aSi film 18 and form a pSi film 14, a relationship between energy density of the laser beam and a grain size of the pSi film 14; (B) selecting a predetermined range of the energy density in the derived relationship; and (C) irradiating a first area including the aSi film 18 with a laser beam at energy density in the selected range of the energy density to thereby polycrystallize the aSi film 18 and form the pSi film 14.

19 Claims, 24 Drawing Sheets

(51) Int. Cl.
*G02F 1/1368* (2006.01)
*H01L 21/02* (2006.01)
*H01L 29/66* (2006.01)
*H01L 29/04* (2006.01)
*H01L 23/544* (2006.01)

(52) U.S. Cl.
CPC ............ *H01L 23/544* (2013.01); *H01L 29/04* (2013.01); *H01L 2223/54426* (2013.01)

(56) References Cited

U.S. PATENT DOCUMENTS

| | | | |
|---|---|---|---|
| 7,645,337 B2 * | 1/2010 | Im | C30B 13/22 |
| | | | 117/43 |
| 9,646,831 B2 * | 5/2017 | Im | B23K 26/083 |
| 2003/0132931 A1 * | 7/2003 | Kimura | G09G 3/2022 |
| | | | 345/212 |
| 2003/0153182 A1 | 8/2003 | Yamazaki et al. | |
| 2003/0218169 A1 * | 11/2003 | Isobe | H01L 29/78603 |
| | | | 257/59 |
| 2007/0290278 A1 * | 12/2007 | Kook | H01L 21/823835 |
| | | | 257/410 |
| 2011/0201183 A1 * | 8/2011 | Moriwaka | H01L 21/02422 |
| | | | 438/487 |
| 2015/0060964 A1 * | 3/2015 | Lai | H01L 31/18 |
| | | | 257/292 |

FOREIGN PATENT DOCUMENTS

JP 4667682 B2 4/2011
JP 5918118 B2 5/2016

\* cited by examiner

| SCREEN SIZE | WIDTH | HEIGHT | PIXEL PITCH | TFT SPACING (4 COLORS, 1Tr) |
|---|---|---|---|---|
| 42 | 930mm | 523mm | 121 μm | 30 μm |
| 50 | 1,107mm | 623mm | 144 μm | 36 μm |
| 60 | 1,328mm | 747mm | 173 μm | 43 μm |

Fig. 3

| ENERGY DENSITY | NOT IRRADIATED | 350 mJ/cm² | 400 mJ/cm² | 450 mJ/cm² |
|---|---|---|---|---|
| OPTICAL MICROSCOPE | |  |  |  |
| SPM (AFM) |  |  |  |  |
| CRYSTAL SHAPE | aSi | SEMI-COMPLETE MELT-CRYSTALLIZED (LATERAL CRYSTAL) | COMPLETE MELT-CRYSTALLIZED (FINE CRYATAL) | |

METHOD OF MANUFACTURING DISPLAY, DISPLAY, AND LIQUID CRYSTAL TELEVISION

INCORPORATION BY REFERENCE

This application is based upon and claims the benefit of priority from Japanese patent application No. 2017-087264, filed on Apr. 26, 2017, the disclosure of which is incorporated herein in its entirety by reference.

BACKGROUND

The present disclosure relates to a method of manufacturing a display, a display, and a liquid crystal television. The present disclosure can be applied to high-performance televisions, for example, high-performance 4K and 8K televisions.

The resolution of liquid crystal television has been increasing from 4K to 8K. For example, the 8K liquid crystal television has about 33 million pixels for 7680×4320, which is four times that of the current 2K liquid crystal television.

A liquid crystal display (referred to as "LCD") used as a display device of a liquid crystal television includes a plurality of pixels arranged, for example, in a matrix. The pixel includes, for example, RGB subpixels. A thin film transistor (TFT) is formed in each subpixel. The TFT controls the corresponding subpixel to be driven.

The TFT is formed on an island-shaped semiconductor thin film provided at a predetermined position of each subpixel. The semiconductor thin film for forming the TFT is, for example, a polysilicon (pSi) film.
Such a pSi film is formed by applying a laser beam to an amorphous silicon (aSi) film on a substrate.

Japanese Patent No. 4053412 describes that, when a laser beam is applied, a slit width is controlled according to a shape of a mask with reference to a marker provided on a semiconductor film. Japanese Patent No. 4477333 describes that the marker is formed by applying a laser beam to the semiconductor film. Japanese Patent No. 4667682 describes that a metal film pattern and an insulating film are formed on a substrate, and then a semiconductor thin film is formed. After that, the laser beam is applied to the semiconductor thin film with reference to the metal film pattern.

SUMMARY

It is desirable that the grain size of the pSi film on which the TFT is formed be large. When the grain size is large, the mobility of electrons can be increased. Examples of method of increasing the grain size of the pSi film include applying a laser beam with low energy density to an aSi film several times. However, applying the laser beam several times in this manner will lower the productivity in manufacturing the displays. Further, when the laser beam with low energy density is applied, the grain size will greatly vary and thus it is difficult to control the grain sizes.

Other problems of the related art and new features of the present disclosure will become apparent from the following descriptions of the specification and attached drawings.

An example aspect is a method of manufacturing a display that includes: (A) deriving a relationship between energy density of a laser beam and a grain size of a polysilicon film when the laser beam is applied to an amorphous silicon film provided on a substrate to thereby polycrystallize the amorphous silicon film and form the polysilicon film; (B) selecting a predetermined range of the energy density in the derived relationship; and (C) irradiating a first area including the amorphous silicon film with a laser beam at energy density in the selected range of the energy density to thereby polycrystallize the amorphous silicon film and form the polysilicon film.

Another example aspect is a method of manufacturing a display in which a plurality of thin film transistors each including a polysilicon film are arranged in a matrix. The method includes: (I) deriving a relationship between energy density of a laser beam that irradiates an amorphous silicon film and an average grain size of the polysilicon films formed from the amorphous silicon film; (II) selecting first energy density of a first laser beam based on the relationship derived in (I); and (III) irradiating the amorphous silicon film in the first area on a substrate with the first laser beam to form the polysilicon film.

Another example aspect is a display including: a plurality of island-shaped polysilicon films arranged in a matrix on a substrate; and a thin film transistor formed on each of the polysilicon films. A grain size of the polysilicon film is less than or equal to a thickness of the polysilicon film.

Another example aspect is a liquid crystal television including the above-mentioned display.

According to the above example aspects, it is possible to provide a method of manufacturing a display, a display, and a liquid crystal television that can improve productivity and make a grain size uniform.

The above and other objects, features and advantages of the present disclosure will become more fully understood from the detailed description given hereinbelow and the accompanying drawings which are given by way of illustration only, and thus are not to be considered as limiting the present disclosure.

BRIEF DESCRIPTION OF DRAWINGS

FIG. 3 is a diagram showing an example of a screen size of an 8K television and installation dimensions of pixels;

DESCRIPTION OF EMBODIMENTS

Hereinafter, a specific embodiment will be described in detail with reference to the drawings. However, the present disclosure is not limited to the following embodiment. The following descriptions and drawings are simplified as appropriate in order to clarify the descriptions.

Embodiment

A display and a method of manufacturing the display according to the embodiment will be described. First, an outline of the display and a panel of the display will be described. Next, a method of manufacturing the display will be described, and then an LCD will be described as an example of the display.

<Outline of Display>

Figure 1:
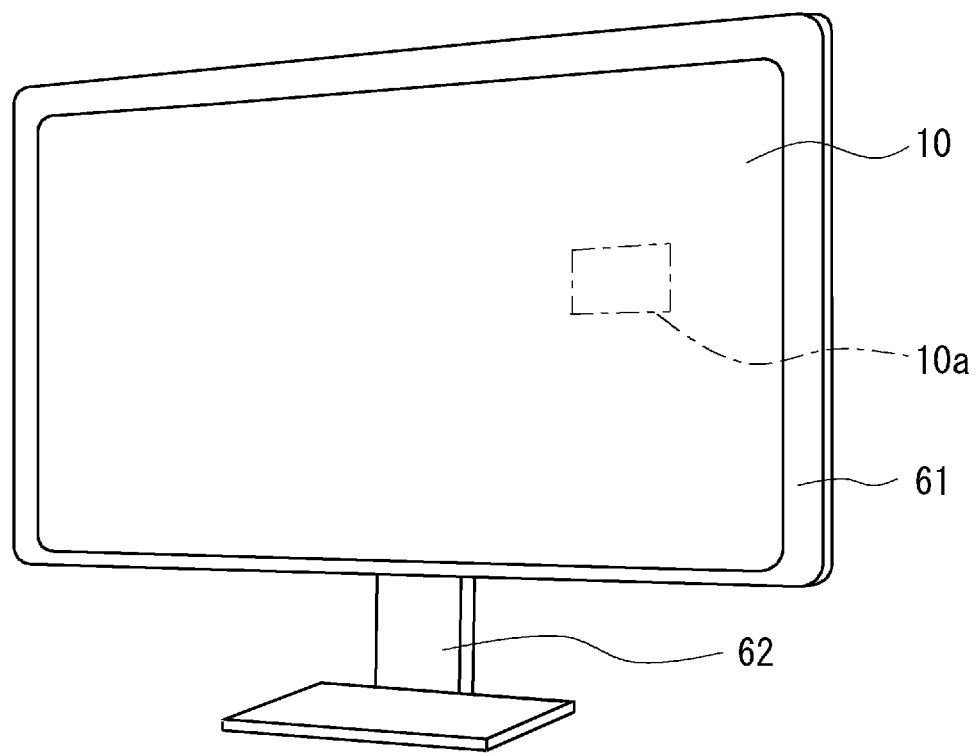
FIG. 1 is a perspective view showing an example of a display according to an embodiment.

First, an outline of the display according to the embodiment will be described. FIG. 1 is a perspective view showing an example of the display according to the embodiment. As shown in FIG. 1, the display 1 includes a panel 10. In addition to the panel 10, the display 1 may include an outer frame 61, a support base 62, a control device (not shown), and the like. The display 1 is used as, for example, a display device of a high-performance 4K or 8K television. However, it may be used as a monitor of a personal computer and the like other than the display device of the 4K or 8K high-performance television.

<Outline of Display Panel>

Figure 2:
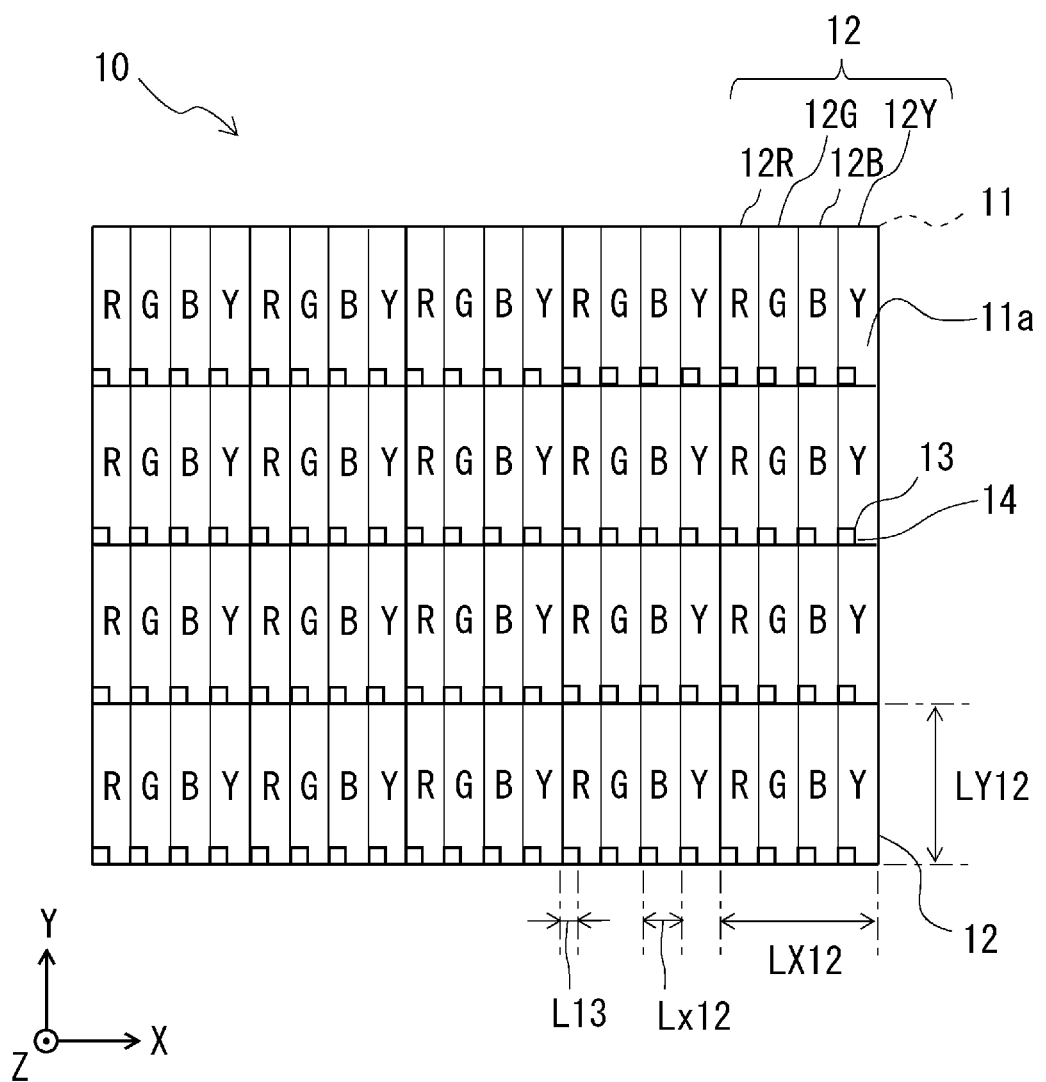
FIG. 2 is a plan view showing an example of a panel of a display according to the embodiment, and is an enlarged view of an area 10a of FIG. 1.

FIG. 2 is a plan view showing an example of the panel 10 of the display 1 according to the embodiment. FIG. 2 is an enlarged view of an area 10a of FIG. 1. As shown in FIG. 2, the panel 10 includes a substrate 11. A plurality of pixels 12 are formed on a surface 11a of the substrate 11. The pixel 12 is, for example, a rectangle when viewed from a direction orthogonal to the surface 11a. The plurality of pixels 12 are arranged in a matrix on the surface 11a of the substrate 11.

Here, an XYZ orthogonal coordinate system is introduced in order to describe the panel 10. One direction in which the plurality of pixels 12 are arranged in a matrix on a plane parallel to the surface 11a of the substrate 11 is defined as an X-axis direction, and the other direction orthogonal to the one direction is defined as a Y-axis direction. A direction orthogonal to the surface 11a is defined as a Z-axis direction. The shape of the pixel 12 viewed from the Z-axis direction is not limited to a rectangle. Further, the arrangement of the plurality of pixels 12 is not limited to the matrix along the X-axis direction and the Y-axis direction.

A length LX12 of one pixel 12 in the X-axis direction and a length LY12 of one pixel 12 in the Y-axis direction, i.e., a pixel pitch, is, for example, LX12=LY12=144 μm. Each pixel 12 includes four subpixels 12R, 12G, 12B, and 12Y (subpixels 12R, 12G, 12B, and 12Y are collectively referred to as subpixels 12R to 12Y). The four subpixels 12R to 12Y are arranged side by side in the X-axis direction in each pixel 12. The length of one subpixel in the Y-axis direction is, for example, 144 μm, which is the same as the LY12, and a length Lx12 of one subpixel in the X-axis direction is, for example, 36 μm. Note that the pixel 12 may include three subpixels 12R, 12G, and 12B. An island-shaped pSi film 14 is formed in each of the subpixels 12R to 12Y.

The island-shaped pSi film 14 is formed at a predetermined position of each of the subpixels 12R to 12Y. For example, the island-shaped pSi film 14 is formed at a corner of each of the subpixels 12R to 12Y in the −X-axis direction and the −Y-axis direction. Therefore, the plurality of island-shaped pSi films 14 are arranged in a matrix on the substrate 11. The island-shaped pSi film 14 has a substantially square shape when viewed from a direction orthogonal to the surface 11a of the substrate 11. A length L13 of the island-shaped pSi film 14 in the X-axis direction and the Y-axis direction is 4 to 10 μm.

The TFT 13 is formed in each island-shaped pSi film 14. Therefore, the TFT 13 is formed at a corner of each subpixel 12R to 12Y in the −X-axis direction and the −Y-axis direction. Further, a plurality of the TFTs 13 are provided and are arranged in a matrix on the substrate 11. The TFT 13 has a substantially square shape when viewed from the direction orthogonal to the surface 11a of the substrate 11. A length of the TFT 13 in the X-axis direction and the Y-axis direction is 4 to 10 μm. A spacing between the island-shaped pSi films 14 in the X-axis direction, i.e., a TFT spacing is, for example, 36 which is the same as the length Lx12 of the subpixel in the X-axis direction.

FIG. 3 is a diagram showing an example of a screen size of the 8K television and the installation dimensions of the pixels. As shown in FIG. 3, for example, with an 8K television display of 7680×4320 pixels, when the screen size is 42 inches (width 930 mm, height 523 mm), the pixel pitch is 121 μm and the TFT spacing is 30 μm. When the screen size is 50 inches (width 1107 mm, height 623 mm), the pixel pitch is 144 μm and the TFT spacing is 36 μm. When the screen size is 60 inches (width 1328 mm, height 747 mm), the pixel pitch is 173 μm and the TFT spacing is 43 μm. One TFT 13 is formed in each of the subpixels 12R to 12Y.

The grain size of polysilicon contained in the island-shaped pSi film 14 is 50 nm or less. For example, the island-shaped pSi film 14 formed on the substrate 11 has a thickness of 50 nm or greater. Therefore, the grain size of the polysilicon contained in the pSi film 14 is less than or equal to the thickness of the pSi film 14. Further, the pSi film 14 preferably has a completely melt-crystallized structure. The pSi film 14 constituting the TFT 13 will be described in detail in the following description of the method of manufacturing the display.

<Method of Manufacturing Display>

Next, a method of manufacturing the display according to the embodiment will be described. First, a laser irradiation device will be described. Next, a surface irradiated with the laser beam will be described, and then the pSi film 14 formed by the laser irradiation will be described. After that, a step of deriving a relationship between the energy density of the laser beam and the grain size, a step of selecting the energy density, and a step of applying the laser beam will be described. First, the laser irradiation device for forming the pSi film 14 will be described.

<Laser Irradiation Device>

Figure 4:
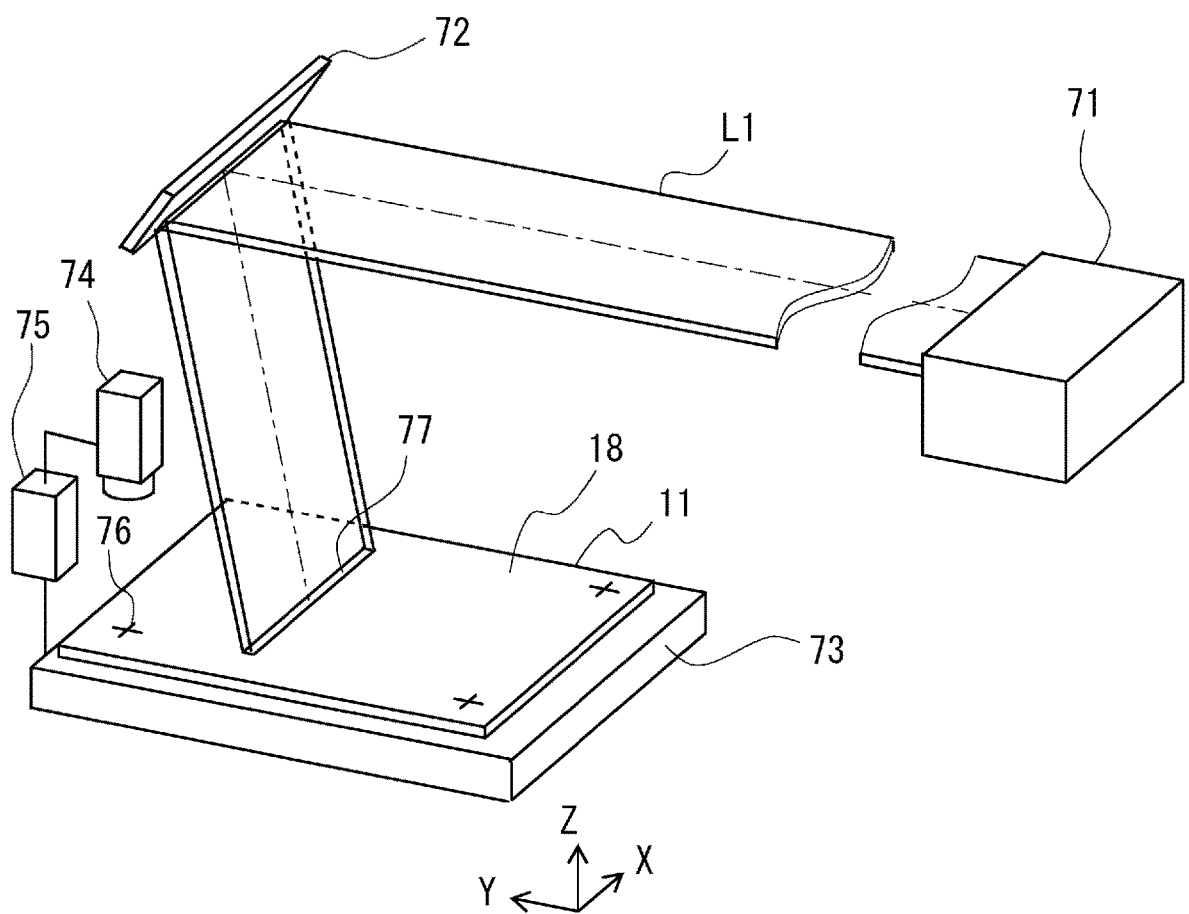
FIG. 4 is a perspective view showing an example of an overview of a laser irradiation device according to the embodiment.

FIG. 4 is a perspective view showing an example of an overview of the laser irradiation device according to the embodiment. As shown in FIG. 4, a laser irradiation device 70 includes a light source 71, a mirror 72, a stage 73, a camera 74, a control unit 75, and an optical member (not shown).

The light source 71 is, for example, an excimer laser device. Note that the light source 71 is not limited to the excimer laser device, and instead may be a solid laser device or the like. A laser beam L1 emitted from the light source 71 passes through an optical path guided by the mirror 72 and other optical members and is applied to the substrate 11 on which an aSi film 18 is formed. The aSi film 18 may be formed into a plurality of island shapes on the substrate 11 before being irradiated with the laser beam. Alternatively, the aSi film 18 may be formed in a layer on the substrate 11. After the aSi film 18 is changed into the pSi film 14 by the laser irradiation, the layered pSi film 14 may be formed into a plurality of island-shaped pSi films 14. For example, a glass substrate having a softening point of 700° C. or lower is used for the substrate 11. Moreover, a gate electrode may be formed on the substrate 11, and an island-shaped or layered aSi film 18 may be formed on the gate electrode.

The substrate 11 is disposed on the stage 73. Markers 76 are formed on the substrate 11. The camera 74 captures the markers 76 and transmits position information of the markers 76 to the control unit 75. The control unit 75 moves the stage 73 to an appropriate position based on the received position information of the markers 76. Then, the laser beam L1 is applied to an appropriate irradiation area on the substrate 11. The area of the substrate 11 irradiated with the laser beam L1 is referred to as an irradiation surface 77.

<Laser Irradiation Surface>

Figure 5:
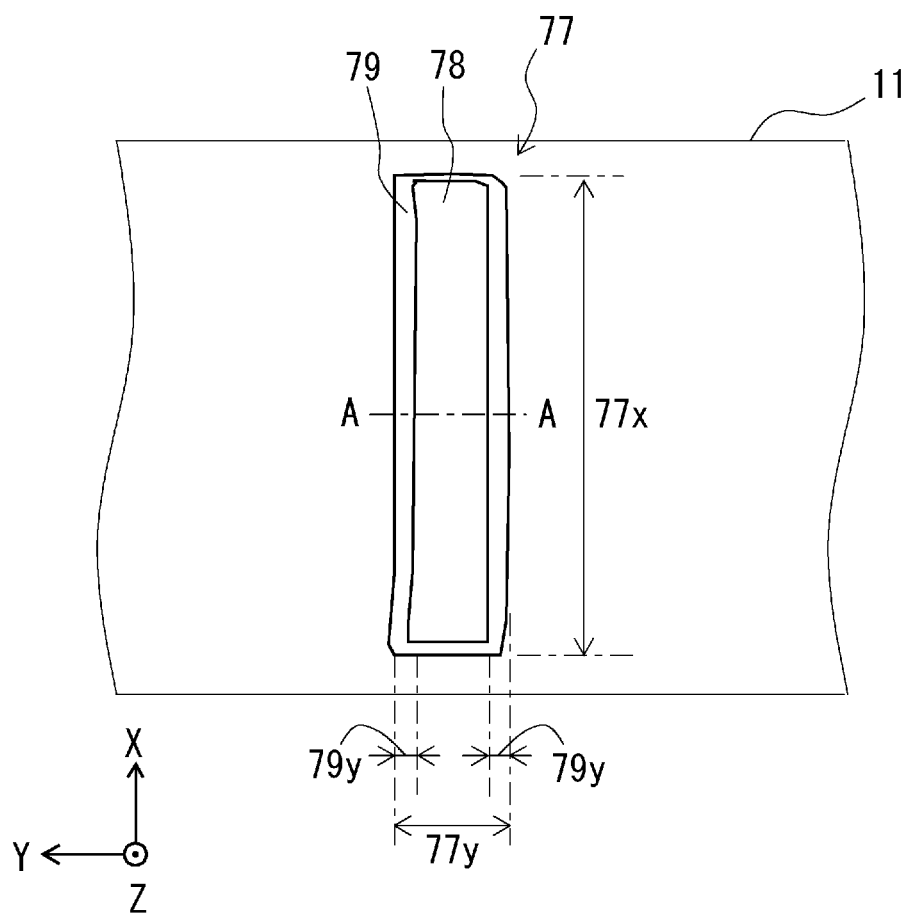
FIG. 5 is a diagram showing an example of a shape of a laser irradiation surface according to the embodiment.

FIG. 5 is a diagram showing an example of a shape of the irradiation surface of the laser beam according to the embodiment. As shown in FIG. 5, the irradiation surface 77 of the laser beam has a rectangular shape. A length 77x of the irradiation surface 77 of the laser beam in the X-axis direction is, for example, 747 mm, and a length 77y of the irradiation surface 77 of the laser beam in the Y-axis direction is 288 μm. The irradiation surface 77 of the laser beam has a rectangular irradiation surface 78 with energy density almost constant at its maximum value and an annular irradiation surface 79 with energy density decreasing toward the outside. The annular irradiation surface 79 is formed with a width 79y of 12 to 35 μm, preferably a width 79y of 15 μm, on a periphery of the irradiation surface 78. The sizes of the irradiation surfaces 77, 78, and 79 are not limited to the above. Further, the shapes of the irradiation surfaces 77, 78, and 79 are not limited to rectangular shapes and annular shapes.

Figure 6:
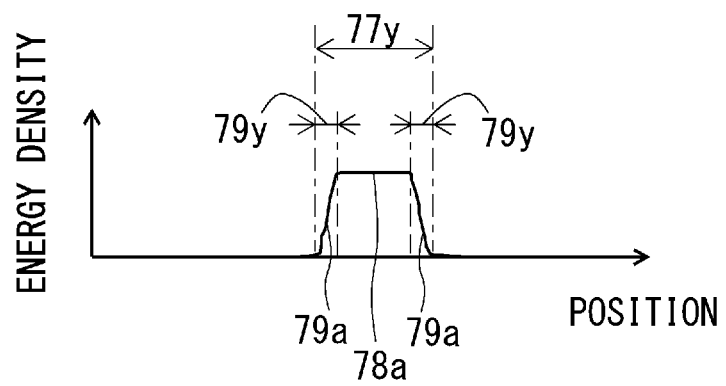
FIG. 6 is a diagram showing an example of a beam profile of a laser beam according to the embodiment.

FIG. 6 is a diagram showing an example of a beam profile of the laser beam according to the embodiment. In FIG. 6, a horizontal axis represents the position of the laser beam in the Y-axis direction, and the vertical axis represents the energy density of the laser beam. FIG. 6 shows the profile of the laser beam in the cross section taken along the line AA of FIG. 5. As shown in FIG. 6, the laser beam includes a flat part 78a having substantially constant energy density at its maximum value and a steepness part 79a having energy density decreasing toward the outside at the periphery of the flat part 78a.

As shown in FIGS. 5 and 6, the rectangular irradiation surface 78 is irradiated with the flat part 78a of the laser beam, and the irradiation surface 79 formed at the periphery of the irradiation surface 78 is the irradiated with the steepness part 79a of the laser beam. As described above, the laser beam includes the flat part 78a having the rectangular irradiation surface 78 and the steepness part 79a having the irradiation surface 79 formed on the periphery of the flat part 78a.

As shown in FIG. 6, the flat part 78a of the laser beam shows a profile of the energy density within a selected range. The energy density of the flat part 78a is in the range of, for example, 400 mJ/cm$^2$ to 500 mJ/cm$^2$. The energy density of the steepness part 79a of the laser beam is smaller than the selected range. The steepness part 79a of the laser beam is a profile other than the profile of the flat part 78a and shows a profile decreasing toward the outside. For example, the energy density of the steepness part 79a decreases from the energy density of the flat part 78a to the energy density of the part not irradiated with the laser beam. Such a laser beam is applied to the aSi film 18 formed on the substrate 11 to thereby form the pSi film 14 on the substrate 11.

<pSi Film>

Figure 7:
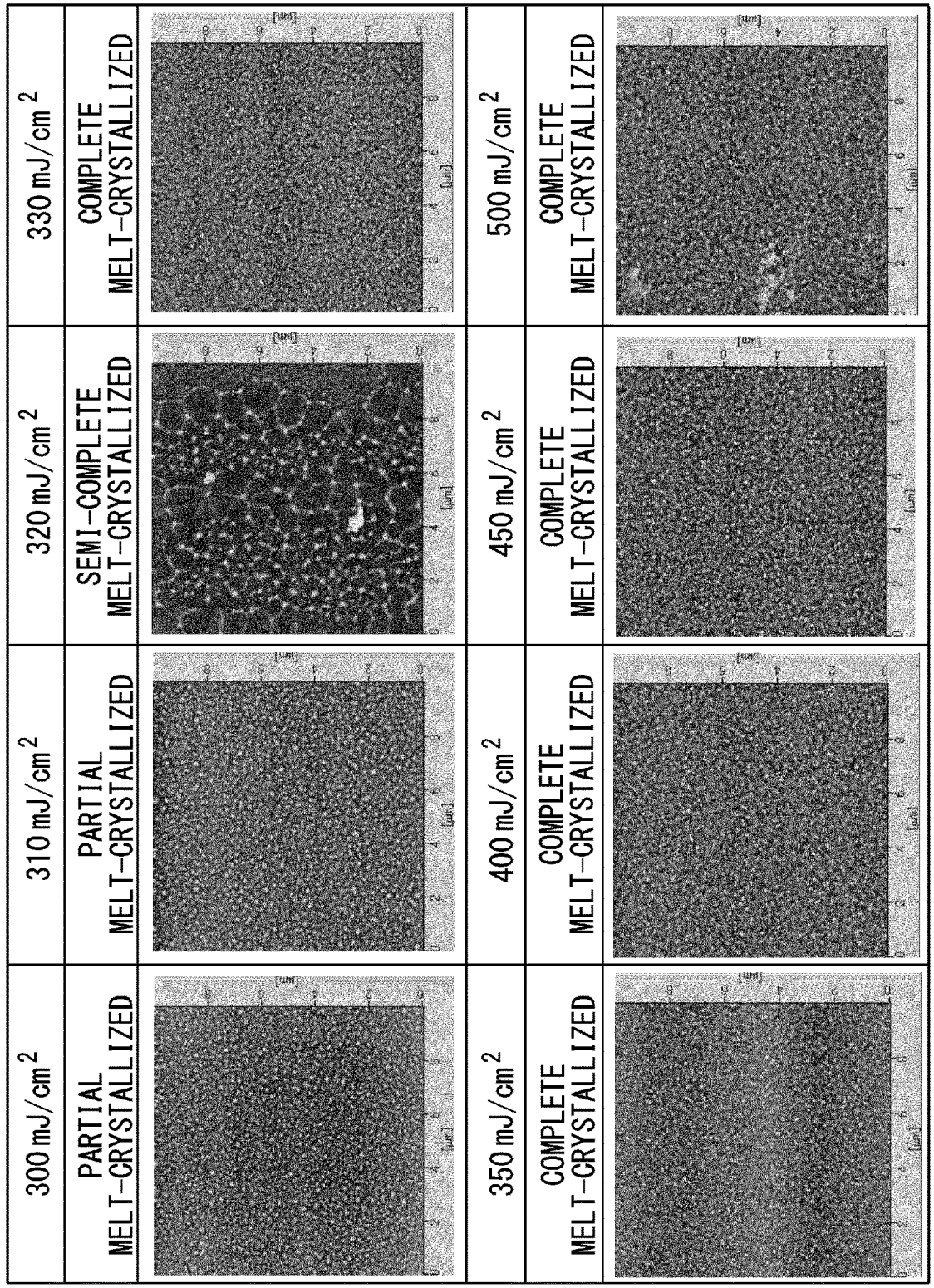
FIG. 7 is a diagram showing an example of a surface shape of a pSi film according to the embodiment.
Figure 8:
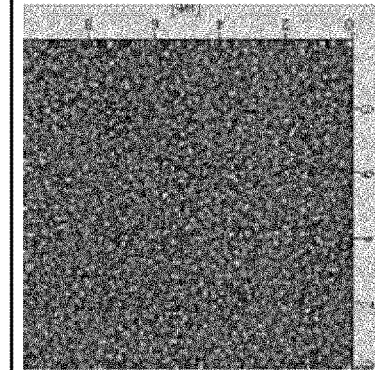
FIG. 8 is a diagram showing an example of a surface shape of a pSi film according to an embodiment, where images in the upper row are observed using an optical microscope, and images in the lower row are observed using a scanning probe microscope.
Figure 8:
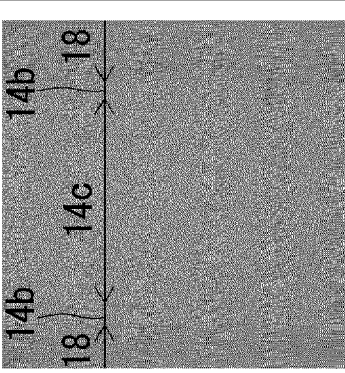
Figure 8:
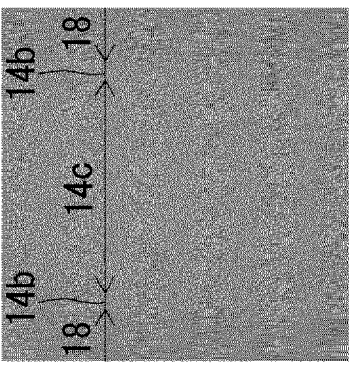
Figure 8:
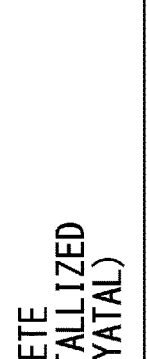
Figure 8:
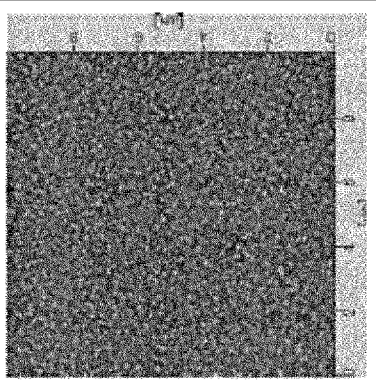
Figure 8:
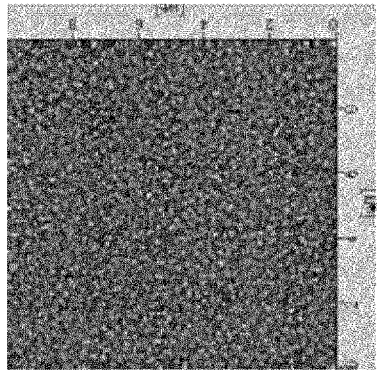
Figure 8:
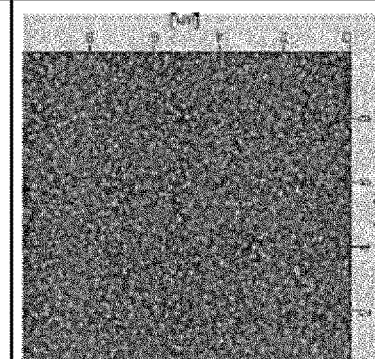

Next, the pSi film 14 formed by irradiating the aSi film 18 on the substrate 11 with the laser beam will be described. FIG. 7 is a diagram showing an example of the surface shape of the pSi film 14 according to the embodiment. The surface shape is observed using a Scanning Probe Microscope (referred to as SPM) or an Atomic Force Microscope (referred to as AFM). FIG. 8 is a diagram showing an example of the surface shape of the pSi film 14 according to the embodiment. In FIG. 8, the images in the upper row are observed using an optical microscope, and the images in the lower row are observed using SPM or AFM.

As shown in FIGS. 7 and 8, the pSi film 14 can be classified into partial melt crystallization, semi-complete melt crystallization, and complete melt crystallization according to the energy density of the irradiated laser beam. A semi-completely melt-crystallized pSi film 14b is also referred to as a lateral crystal. Further, the completely melt-crystallized pSi film 14c is also referred to as a fine crystal.

For example, with the energy density of 310 mJ/cm$^2$ or less, the pSi film 14 is a partially melt-crystallized pSi film 14a. With the energy density of 320 mJ/cm$^2$, or in some cases 350 mJ/cm$^2$, the pSi film 14 is a semi-completely melt-crystallized pSi film 14b. With the energy density of 330 mJ/cm² or greater, or in some cases 400 mJ/cm² or greater, the pSi film 14 is a completely melt-crystallized pSi film 14c. The grain size of the completely melt-crystallized pSi film 14c is 50 nm or less.

As shown in the images observed using the optical microscope in the upper rows of FIG. 8, when the aSi film 18 is irradiated with the laser beam at the energy density of 400 mJ/cm² or greater, the part irradiated with the flat part 78a is the completely melt-crystallized pSi film 14c (fine crystal). The part irradiated with the steepness part 79a is the semi-completely melt-crystallized pSi film 14b (lateral crystal).

Figure 9:
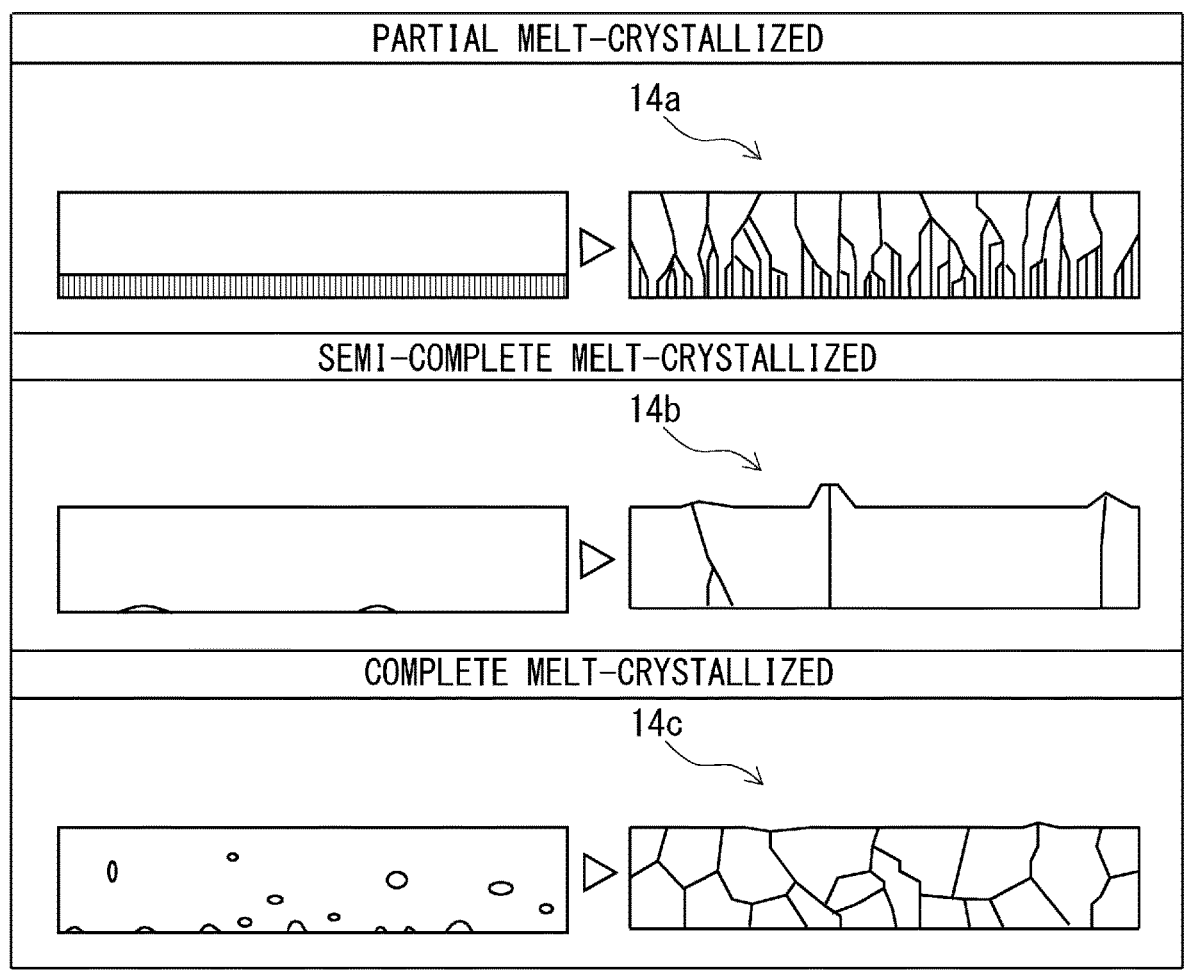
FIG. 9 is a cross-sectional diagram showing an example of a classification of crystallized pSi films according to the embodiment, where images in the upper row show partially melt-crystallized pSi films, images in the middle row show semi-completely melt-crystallized pSi films, and images in the lower row show completely melt-crystallized pSi films.

FIG. 9 is a cross-sectional diagram showing an example of the classification of the crystallized pSi film 14 according to the embodiment. In FIG. 9, drawings in the upper row show the partially melt-crystallized pSi film 14a, drawings in the middle row show the semi-completely melt-crystallized pSi film 14b, and drawings in the lower row show the completely melt-crystallized pSi film 14c.

As shown in the partially melt-crystallized pSi film 14a in the upper row of FIG. 9, a solid-liquid interface of the aSi film 18 is positioned inside the film when the aSi film 18 is irradiated with the laser beam, and then the aSi film 18 is crystallized to form the pSi film 14a. Only a surface of the Si film is crystallized as pSi.

As shown in the semi-completely melt-crystallized pSi film 14b in the middle row of FIG. 9, when the aSi film 18 is irradiated with the laser beam, crystal nuclei that do not melt are scattered at an interface of the glass substrate 11, and the aSi film 18 is crystallized around the nuclei to form the pSi film 14b. The pSi film 14b contains pSi having a grain size greater than the film thickness of the pSi film 14b. The energy density at which the semi-completely melt-crystallized pSi film 14b is formed varies depending on conditions as shown in FIGS. 7 and 8. It is therefore difficult to control the grain size of pSi when the semi-completely melt-crystallized pSi film 14b is formed. In the semi-completely melt-crystallized pSi film 14b, crystal grain boundaries reaching from the interface with the substrate 11 to the surface of the pSi film 14b are formed.

As shown in the completely melt-crystallized pSi film 14c in the lower row of FIG. 9, the entire Si film is melted and crystallized to form the pSi film 14c. The entire pSi film 14c contains pSi having a grain size less than or equal to the film thickness. The grain size of the completely melt-crystallized pSi film 14c is, for example, 50 nm or less. In the completely melt-crystallized pSi film 14c, different crystal grain boundaries cross crystal grain boundaries reaching from the interface with the substrate 11 to the surface of the pSi film 14c.

In this completely melt-crystallized pSi film 14c, no large difference can be confirmed in the surface shape, thereby reducing variations in the characteristics generated at the time of forming the TFTs 13. The grain size of the pSi film 14c is defined as, for example, an average value of grain sizes. Alternatively, the grain size may be defined as a maximum value other than the average value or may be defined as a predetermined deviation value.

Figure 10:
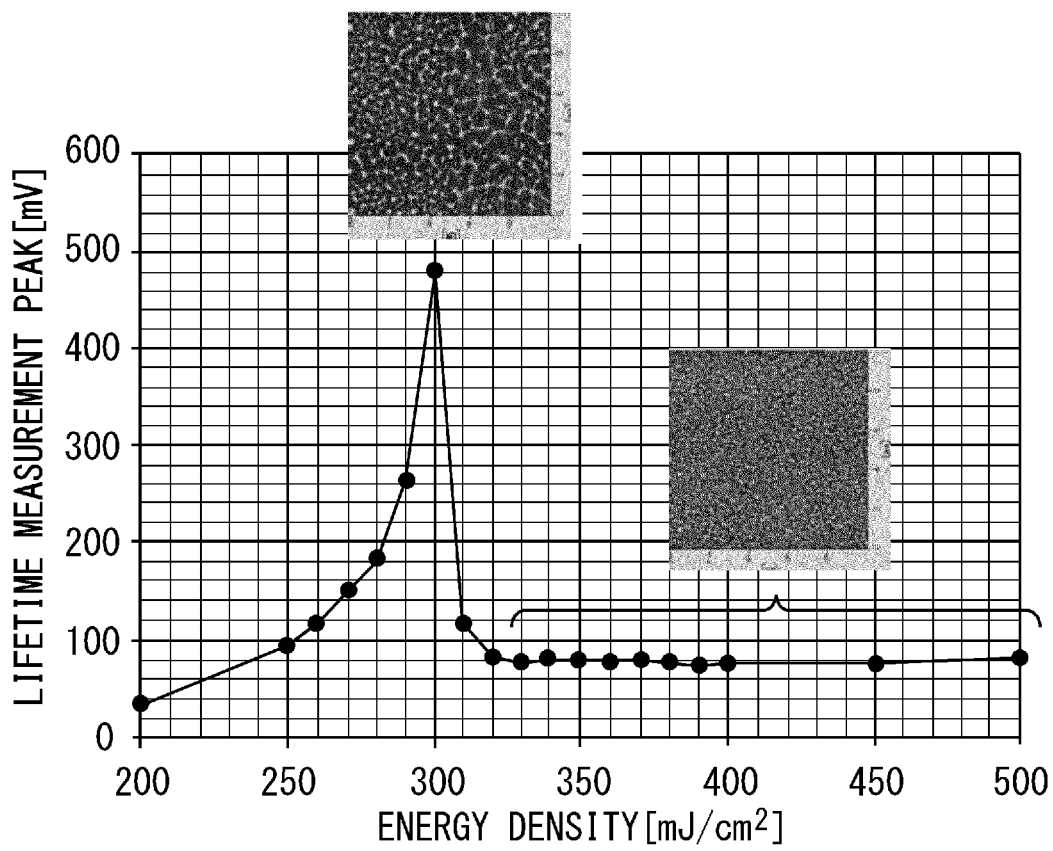
FIG. 10 is a graph showing an example of a relationship between energy density of the laser beam and a size of the grain size of the pSi film, where a horizontal axis represents the energy density of the laser beam, and a vertical axis represents a peak value in lifetime measurement.

FIG. 10 is a graph showing an example of a relationship between the energy density of the laser beam and the grain size of the pSi film 14. In FIG. 10, a horizontal axis represents the energy density of the laser beam, and a vertical axis represents a peak value in lifetime measurement. In the pSi film 14, it is difficult to precisely measure the lifetime because of the influence of grain boundaries. However, the lifetime can be estimated from the peak value by using the fact that the peak value when the carrier concentration injected by the optical pulse decreases over time correlates with the lifetime. It has been found that the peak value in the lifetime measurement thus estimated has a positive correlation with mobility of electrons and the grain size of polysilicon. Therefore, the peak value in the lifetime measurement indicates the grain size of polysilicon.

As shown in FIG. 10, when the energy density becomes 200 mJ/cm² or greater, the peak value in the lifetime measurement is increased. Then, the peak value reaches its maximum value at the energy density of 300 mJ/cm². At the energy density of 310 mJ/cm², the peak value sharply decreases, and further decreases to the energy density of 320 mJ/cm². When the energy density is 330 mJ/cm² or greater, the peak value stays at a substantially constant value.

For example, at the energy density of 320 mJ/cm², the change rate of the peak value normalized by the maximum value {(normalized peak value at 320 mJ/cm²)−(normalized peak value at 310 mJ/cm²)}/(310 mJ/cm²) is 32%. On the other hand, at the energy density of 330 mJ/cm², the change rate of the peak value normalized by the maximum value {(normalized peak value at 330 mJ/cm²)−(normalized peak value at 320 mJ/cm²)}/(320 mJ/cm²) is 2.5%. In the range where the energy density is 330 mJ/cm² or greater, the change rate of the peak value normalized by the maximum value is 5% at the maximum.

In FIG. 10, the peak value in the lifetime measurement reaches its maximum value at the energy density of 300 mJ/cm². The pSi film 14 at this time is a semi-completely melt-crystallized pSi film 14b (lateral crystal). Thus, the peak value and the grain size in the lifetime measurement have a positive correlation. The energy density at which the grain size of the pSi film 14 reaches its maximum value varies depending on the conditions, such as the film thickness. Thus the variations in the energy density is large. This can be seen in the result of the surface shape shown in FIGS. 7 and 8.

However, when the energy density becomes greater than the maximum energy density, the grain size of the pSi film 14 stays almost constant. The pSi film at this time is a completely melt-crystallized pSi film 14c (fine crystal). The grain size of the pSi film 14c is 50 nm or less. In addition, a range of the energy density at which the completely melt-crystallized pSi film 14c is formed is as wide as 330 to 500 mJ/cm².

The pSi film 14 in the display 1 of this embodiment is formed with the laser energy density of 400 mJ/cm² or greater. Accordingly, the grain size of pSi contained in the island-shaped pSi film 14 is 50 nm or less. Further, the island-shaped pSi film 14 has a completely melt-crystallized structure. The range of the energy density at which the grain size of pSi can become 50 nm or less is wide. That is, the process margin can be expanded. Accordingly, it is possible to improve the productivity and make the grain size uniform.

Note that the completely melt-crystallized pSi film 14c with the grain size of 50 nm or less has mobility greater than mobility of the aSi film, which is 1 to 10 cm²/Vs, preferably 5 to 10 cm²/Vs. This value is about ⅛ of the mobility of the semi-completely melt-crystallized pSi film 14b.

In theory, it is preferable that the mobility be large, and thus the grain size of the pSi film 14 be preferably large. However, the TFT 13 according to this embodiment does not need such large mobility and the mobility in the range of 5 to 10 cm²/Vs is sufficient. This is because TFTs used for large-screen high-performance televisions represented by 4K and 8K have fewer limitations on the areas than TFTs used for relatively small displays for smartphones and the like. Thus the gate width can be easily increased. When the gate width is sufficiently large, a sufficient current for driving each subpixel can be obtained even when the carrier mobility of the channel is relatively small. Further, in this embodiment, an irradiation method is employed, which gives priority to productivity, i.e., requiring only one irradiation, and a process margin allowing a wide range of density while ensuring necessary mobility. Specifically, the aSi film 18 is irradiated once with the flat part of the high energy density laser beam. This improves the productivity, reduces the production cost, and makes the grain size uniform.

On the other hand, the semi-completely melt-crystallized pSi film 14*b* needs to be irradiated with several laser beams with low energy density. For this reason, the semi-completely melt-crystallized pSi film 14*b* is inferior in productivity. The energy density of laser beams with low energy density tends to vary. This causes the grain size of the pSi film to tend to vary as well.

<Relationship Between Energy Density of Laser Beam and Grain Size>

Figure 11:
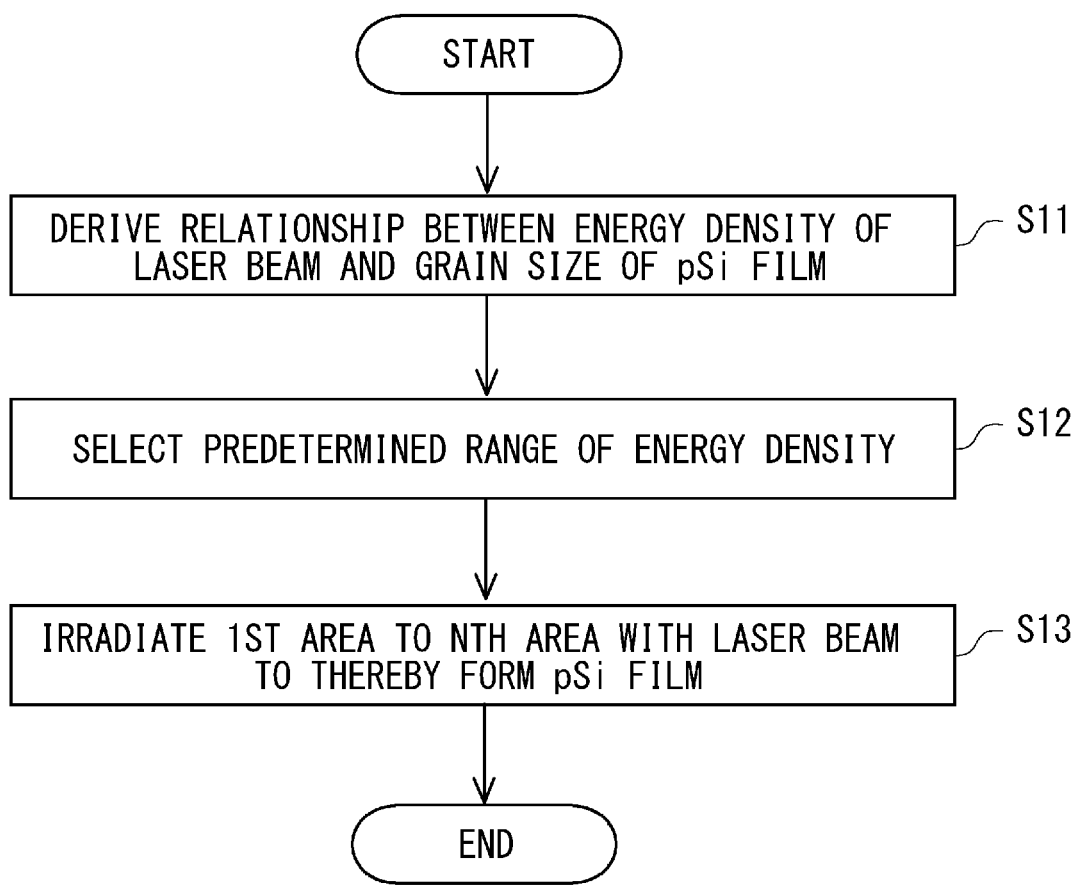
FIG. 11 is a flowchart showing an example of a method of manufacturing the display according to the embodiment.

Next, in the method of manufacturing the display, a step of deriving the relationship between the energy density of the laser beam and the grain size, a step of selecting the energy density, and a step of applying the laser beam will be described. FIG. 11 is a flowchart showing an example of the method of manufacturing the display according to the embodiment. First, as shown in Step S11 in FIG. 11, the relationship between the energy density of the laser beam and the grain size of pSi is derived.

As described in FIGS. 7 to 10, the size of the grains contained in the pSi film 14 varies depending on the energy density of the laser to be applied. The aSi film 18 provided on the substrate 11 is irradiated with the laser beam, then the aSi film 18 is polycrystallized to form a pSi film. In this case, the relationship between the energy density of the laser beam and the grain size of the polysilicon film is derived. In this way, the relationship shown in FIGS. 7 to 10 is derived.

<Selection of Energy Density>

Next, as shown in Step S12 of FIG. 11, a predetermined range of the energy density is selected in the derived relationship. For example, as shown in FIGS. 7 to 10, the predetermined range of the energy density is selected from a range of the energy density at which the grain size becomes the thickness of the pSi film 14 or less in the relationship between the energy density of the laser beam and the grain size. For example, as shown in FIGS. 7 and 8, when the energy density is 400 mJ/cm$^2$ or greater, the grain size of the pSi film 14 stays at a substantially constant value. The range of the energy density of the laser beam in which the grain size does not greatly vary is selected as the range of energy density of the laser beam. By doing so, a uniform grain size can be achieved by a single irradiation.

Further, as shown in FIG. 10, in the relationship between the energy density of the laser beam and the grain size, the predetermined range of the energy density is selected from a range of the energy density in which the peak value in the lifetime measurement that is correlated with the grain size is greater than the maximum energy density, and a range of the energy density in which the change rate of the peak value normalized with the maximum value at different levels of the energy density is 5% or less. By doing so, a stable grain size can be achieved by a single irradiation. This expands the process margin, improves the productivity, and makes the grain size uniform.

<Step S13: Irradiation with Laser Beam>

Next, the aSi film 18 is irradiated with a laser beam. A separate description for the step of forming the pSi film 14 by applying the laser beam will be given for each of the two forms of the aSi film 18. One form of the aSi film 18 is that the aSi film 18 on the substrate 11 is formed into a plurality of island-shaped aSi films 18 before the laser irradiation. Another form of the aSi film 18 is that the aSi film 18 is formed in a layer on the substrate 11, and then irradiated with the laser beam so that it is changed into the pSi film 14. After that, the layered pSi film 14 is formed into a plurality of island-shaped pSi films 14. Firstly, the case where the aSi film 18 on the substrate 11 is formed into the plurality of island-shaped aSi films 18 before the laser irradiation will be described.

Figure 12:
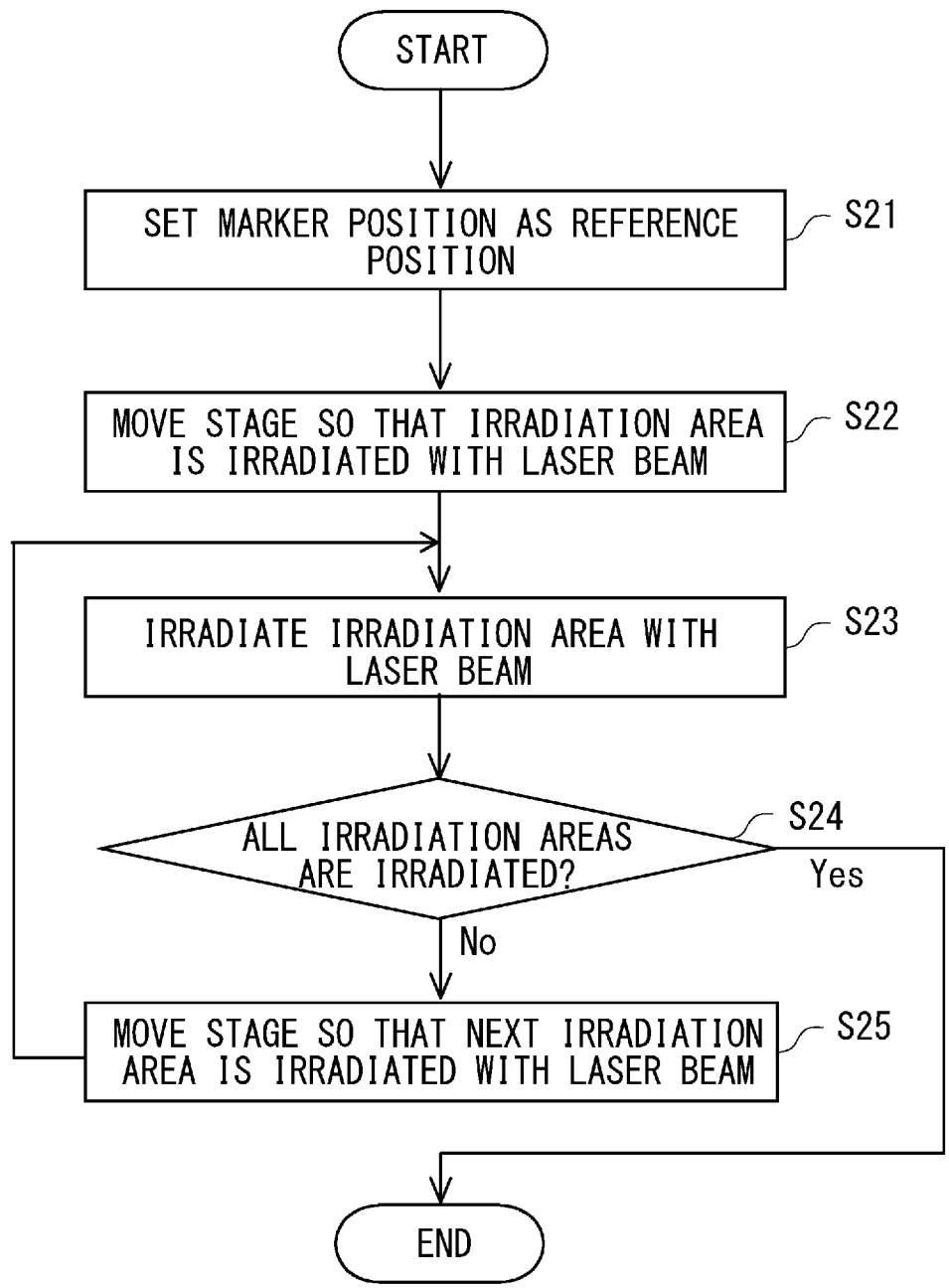
FIG. 12 is a flowchart showing an example of a laser irradiation method according to the embodiment.
Figure 13:
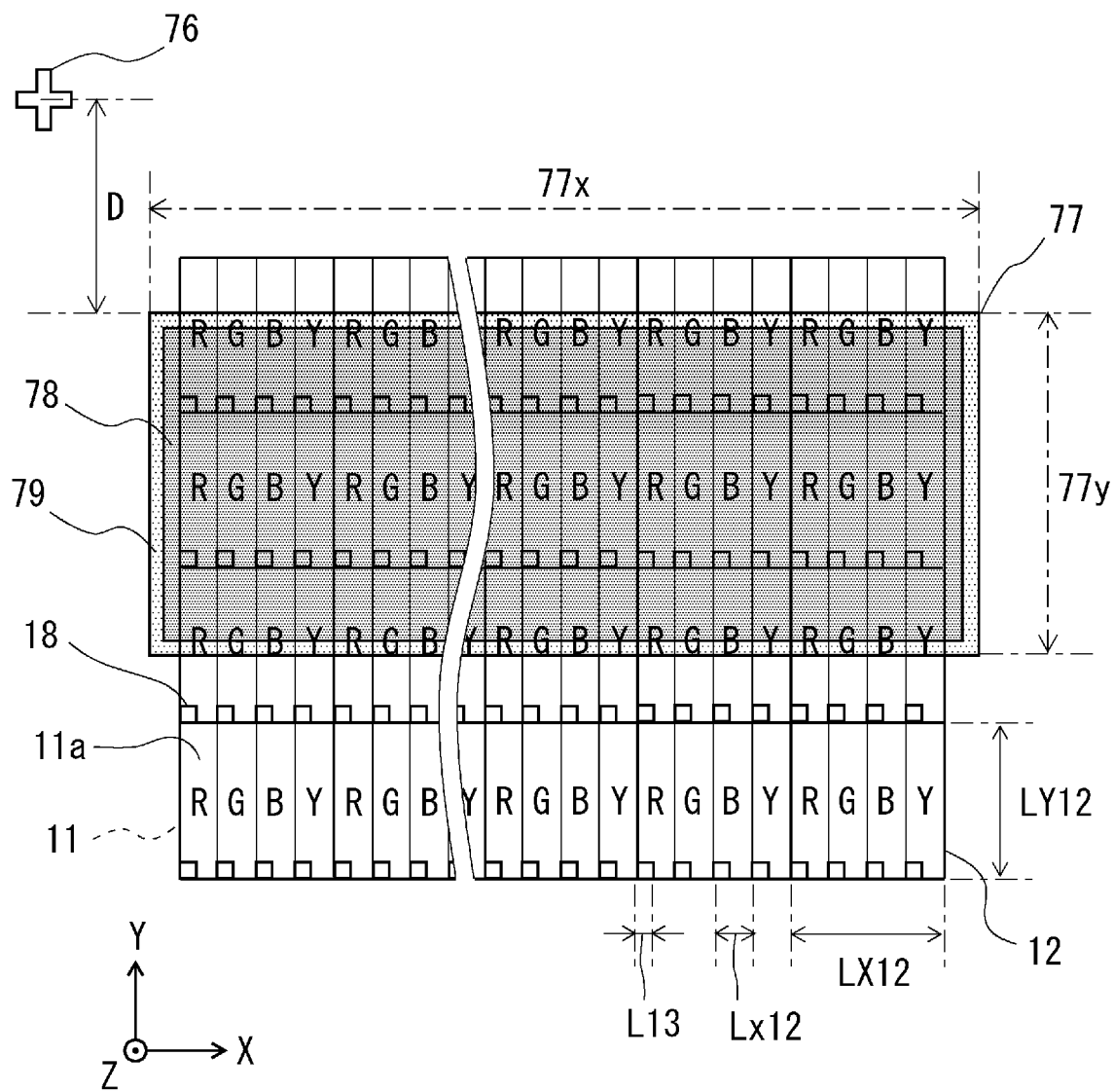
FIG. 13 is a plan view showing an example of an irradiation area of the laser beam according to the embodiment.

As shown in Step S13 of FIG. 11, when there are N irradiation areas to be irradiated with the laser beam on the substrate 11, first to Nth areas are irradiated with the laser beam to polycrystallize the aSi film, thereby forming the pSi film 14. FIG. 12 is a flowchart showing an example of the laser irradiation method according to the embodiment. FIG. 13 is a plan view showing an example of the irradiation area of the laser according to the embodiment.

As shown in Step S21 of FIG. 12, the position of the marker 76 is set as a reference position. For example, the control unit 75 sets the position information of the marker 76 received from the camera 74 as a reference position. As shown in FIGS. 4 and 13, at least one marker 76 is provided on the substrate 11. For example, the markers 76 are formed at four corners of the substrate 11. Therefore, the control unit 75 sets one or more markers 76 as the reference position(s).

Next, as shown in Step S22 of FIG. 12, the stage 73 is moved so that the irradiation area is irradiated with the laser beam. For example, as shown in FIG. 13, the distance between the marker 76 and the irradiation position is defined as D. In this case, the control unit 75 moves the stage 73 so that the irradiation area is positioned at the distance D from the marker 76. The distance D between the marker 76 and the irradiation position is, for example, 19.5 μm in the Y-axis direction.

Next, as shown in Step S23 of FIG. 12, the irradiation area is irradiated with the laser beam. When the irradiation area is irradiated with the laser beam, in Step S12 of FIG. 11, the laser beam is applied with the energy density in the selected range of the energy density. The irradiation area includes a predetermined number of island-shaped aSi films 18 on the substrate where the plurality of island-shaped aSi films 18 are arranged in matrix on the substrate. In this manner, the irradiation area is irradiated with the laser beam to polycrystallize the aSi film 18, thereby forming the pSi film. When the aSi film 18 is polycrystallized, the entire aSi film in the thickness direction is melted to form the pSi film 14 having a grain size less than or equal to the thickness of the pSi film 14. This ensures the mobility of electrons, improves the uniformity of the grain size, and improves the productivity.

As shown in FIG. 13, when the length 77*y* of the irradiation surface 77 in the Y-axis direction is 288 μm and the pixel pitch is 144 μm, the irradiation area includes two rows of island-shaped aSi films 18 in the Y-axis direction. When the length 77*x* of the irradiation surface 77 in the X-axis direction is 747 mm and a length of the panel 10 in the X-axis direction is 623 mm, a beam length> a panel size. Therefore, the irradiation surface 77 includes from one end to the other end of the panel 10 in the X-axis direction.

The irradiation surface 78 of the flat part 78*a* covers a part including the aSi film 18 in the irradiation area. Therefore, the flat part 78*a* is applied to the aSi film 18 to form the completely melt-crystallized pSi film 14*c*. Further, a predetermined number of aSi films 18 in the irradiation area are simultaneously irradiated. On the other hand, the irradiation surface 79 of the steepness part 79a covers a part other than the aSi film 18 in the irradiation area. Thus, the steepness part 79a is not applied to the aSi film 18.

Next, as shown in Step S24 of FIG. 12, it is determined whether all irradiation areas on the substrate 11 have been irradiated. When all the irradiation area are not irradiated (No), as shown in Step S25, the stage 73 is moved so that the next irradiation area is irradiated with the laser beam. Specifically, the control unit 75 moves the position of the irradiation area by the length of the irradiation area in the X-axis direction or in the Y-axis direction with reference to the position information of the marker 76 captured by the camera 74. For example, as shown in FIG. 13, the stage 73 is moved so that it is moved by the length 77y=288 µm in the Y-axis direction.

Then, the process returns to Step S23, and the irradiation area is irradiated with the laser beam. The crystallization rate is defined by the following equation (1).

Crystallization rate=(length 77x of the irradiation surface 77)×(length 77y of the irradiation surface 77)×(the number of irradiations per second)      (1)

Here, the length 77x is 747 mm and the length 77y is 288 µm. When the number of irradiations per second is 600 Hz, the crystallization rate is 1290 cm$^2$/s. This crystallization rate is 14.7 times as high as the crystallization rate of 20 times of irradiations at low energy density. As described above, the manufacturing method according to this embodiment achieves high throughput and thus has improved productivity.

An arbitrary irradiation area from the first irradiation area to the (N−1)th irradiation area is defined as a first area and a irradiation area to be irradiated following the first area is defined as a second area. In this case, a predetermined number of aSi films 18 in the first area are simultaneously irradiated, and then a predetermined number of aSi films 18 in the second area other than the first area are simultaneously irradiated. This enables the pSi film to be formed by a single irradiation with a laser beam, and thus the productivity can be improved.

Further, the plurality of island-shaped aSi films 18 are arranged in a matrix in the X-axis direction and the Y-axis direction. Then the spacing between the island-shaped aSi films 18 next to each other in the X-axis direction is smaller than the gap between the island-shaped aSi films 18 next to each other in the Y-axis direction, the area to be irradiated next is made to be adjacent to the previous irradiation area in the Y-axis direction. That is, the plurality of island-shaped aSi films 18 are arranged in a matrix in one direction and another direction crossing the one direction. The spacing between the island-shaped aSi films 18 next to each other in one direction is smaller than the spacing between the island-shaped aSi films 18 next to each other in the other direction. Moreover, the second area is adjacent to the first area on the other direction side.

When the irradiation surface 77 of the laser beam is moved along the direction in which the spacing between the island-shaped aSi films 18 is wide, the steepness part 79a can be easily positioned between the island-shaped aSi films 18. This prevents the aSi film 18 from being irradiated with the steepness part 79a.

A plurality of irradiation areas are provided on the substrate 11, and irradiation areas other than the irradiation areas already irradiated with the laser beam are sequentially irradiated. In this manner, each irradiation area is irradiated only once to improve the uniformity of the grain size. Further, each irradiation area is irradiated with the laser beam with reference to the marker 76. This allows each irradiation area to be accurately irradiated. Note that a mask covering the irradiation areas other than the irradiation areas to be irradiated with the laser beam may be included. With such a mask, it is possible to ensure that irradiation is not performed on areas other than the irradiation area. In some cases, the irradiation area may be irradiated with the laser beams several times (<about 5 times). This further improves the uniformity of the grain size.

In Step S24 of FIG. 12, when all the irradiation areas are irradiated, the laser irradiation is ended. In this manner, the first area to the Nth area are irradiated with the laser beam to polycrystallize the aSi film, thereby form the pSi film 14.

Figure 14:
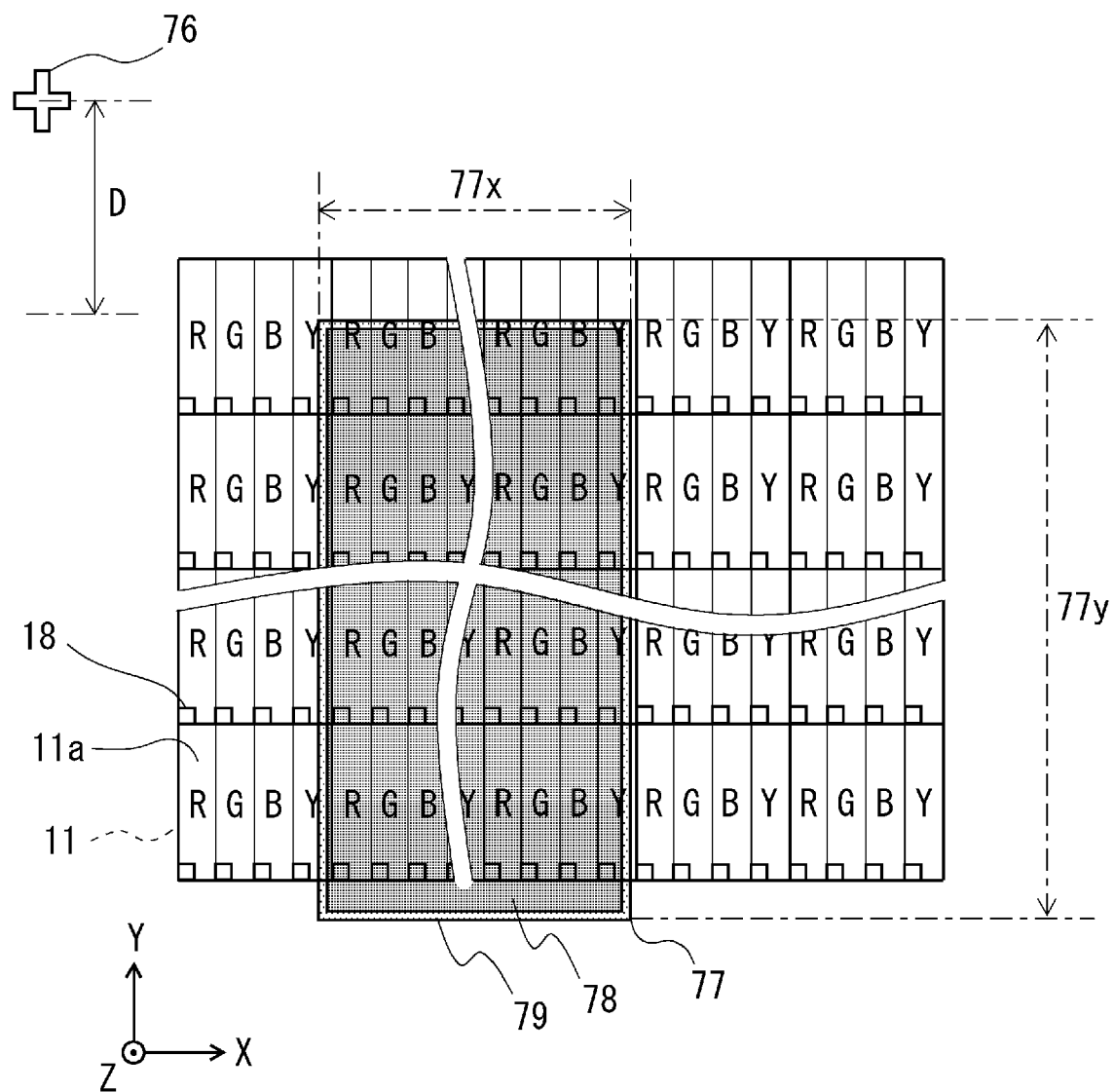
FIG. 14 is a plan view showing an example of another irradiation area of the laser beam according to the embodiment.

FIG. 14 is a plan view showing an example of another irradiation area of the laser beam according to the embodiment. As shown in FIG. 14, the length 77x of the irradiation surface 77 in the X-axis direction may be less than the length of the substrate 11 in the X-axis direction. For example, the length of the irradiation surface 77 in the X-axis direction is 150 mm and the length of the irradiation surface 77 in the Y-axis direction is 864 µm. Even in this case, the laser beam is applied in such a way that the irradiation surface 79 of the steepness part 79a is positioned between the island-shaped pSi films 14.

In FIG. 14, the length 77x is 150 mm and the length 77y is 864 µm. When the number of irradiations per second is 500 Hz, the crystallization rate is 648 cm$^2$/s. This crystallization rate is 7.4 times as high as the crystallization rate of 20 times of irradiations with low energy density.

Next, another form of the pSi film 14 will be described. Specifically, the aSi film 18 formed in a layer on the substrate 11 is irradiated with the laser beam to change the aSi film 18 into the pSi film 14. After that, the layered pSi film 14 is formed into a plurality of island-shaped pSi films 14.

As shown in Step S13 of FIG. 11, when there are N irradiation area to be irradiated with the laser beam on the substrate 11, first to Nth areas are irradiated with the laser beam to polycrystallize the aSi film, thereby forming the pSi film 14. In a manner similar to the plurality of island-shaped aSi films 18, the layered aSi film 18 is irradiated with the laser beam in accordance with the flowchart of FIG. 12.

The following processes for the layered aSi film 18 are the same as those for the island-shaped aSi film 18. In Step S21 of FIG. 12, setting the position of the marker 76 as the reference position, in Step S22, moving the stage 73 so that the irradiation area in Step S22 is irradiated with the laser beam, and in Step S23, irradiating the irradiation area with the laser beam. At the time of the laser irradiation, the process for the layered aSi film 18 is the same as that for the island-shaped aSi film 18 in that, in Step S12 of FIG. 11, the laser beam is applied with the energy density in the selected range of the energy density.

However, in the case of the layered aSi film 18, the irradiation area does not include a plurality of island-shaped aSi films 18. The irradiation area includes a certain part of the layered aSi film 18 on the substrate 11. The irradiation area includes the aSi film 18 on which a predetermined number of pSi films 14 are formed on the substrate 11 where the plurality of island-shaped pSi films 14 are arranged in a matrix after the laser irradiation. In this way, when the irradiation area including the certain part of the aSi film 18 is irradiated with the laser beam, the aSi film 18 is polycrystallized to form the pSi film. In order to polycrystallize the aSi film 18, the entire aSi film in the irradiation area in the thickness direction is melted to form the pSi film 14 having a grain size less than or equal to the film thickness of the pSi film 14. This ensures the mobility of electrons, improves the uniformity of the grain size, and improves the productivity. After the aSi film 18 in the first irradiation area is irradiated, the aSi film 18 in the second irradiation area other than the first irradiation area is irradiated. For example, in the substrate 11 in which a plurality of island-shaped pSi films 14 are arranged in a matrix in one direction and another direction crossing the one direction after the laser irradiation, when the spacing between island-shaped pSi films 14 next to each other in the one direction is smaller than the spacing between the island-shaped pSi films 14 that are next to each other in the other direction, the second irradiation area is adjacent to the first irradiation area on the other direction side.

Next, as shown in Step S24 of FIG. 12, it is determined as to whether all irradiation areas on the substrate 11 have been irradiated. When all the irradiation areas are not irradiated (No), as shown in Step S25, the stage 73 is moved so that the next irradiation area is irradiated with the laser beam. Then, the process returns to Step S23, and the irradiation area is irradiated with the laser beam.

In Step S24, when all the irradiation areas are irradiated, the laser irradiation is ended. In this manner, the first area to the Nth area including the certain area of the layered aSi film 18 on the substrate 11 are irradiated with the laser beam to polycrystallize the aSi film, thereby forming the pSi film 14. After that, the layered pSi film 14 is formed into the plurality of island-shaped pSi films 14. For example, the plurality of island-shaped pSi films 14 are formed by the photolithography process. To form the plurality of island-shaped pSi films 14, as described above, the plurality of island-shaped pSi films 14 are formed from the part irradiated with the flat part 78a of the laser beam. Conversely, the part of the aSi film 18 from which the plurality of island-shaped pSi films 14 are to be formed is irradiated with the flat part 78a of the laser beam. Then, the steepness part 79a is applied to the part which will not become the island-shaped pSi films 14. The crystallization rate is the same as that of the island-shaped aSi films 18 described above.

<Method of Manufacturing TFT>

Next, a method of manufacturing a semiconductor device including the TFT 13 in the pSi film 14 will be described. FIGS. 15 to 22 are process cross-sectional diagrams showing processing of manufacturing the semiconductor device including the TFT 13. In the following description, a method of manufacturing a semiconductor device including an inverted staggered TFT 13 will be described.

Figure 15:
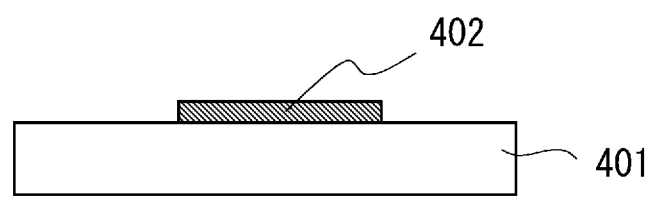
FIG. 15 is a process cross-sectional diagram showing processing of manufacturing a semiconductor device including a TFT according to the embodiment.

First, as shown in FIG. 15, a gate electrode 402 is formed on a glass substrate 401. Note that the glass substrate 401 corresponds to the above-described substrate 11. For the gate electrode 402, for example, a metal thin film containing aluminum or the like can be used. The metal thin film is formed on the glass substrate 401 by the sputtering method or the evaporation method. Then, the metal thin film is patterned by photolithography to thereby form the gate electrode 402. In the photolithography method, processing such as resist coating, exposure, development, etching, resist peeling, and the like is performed.

Figure 16:
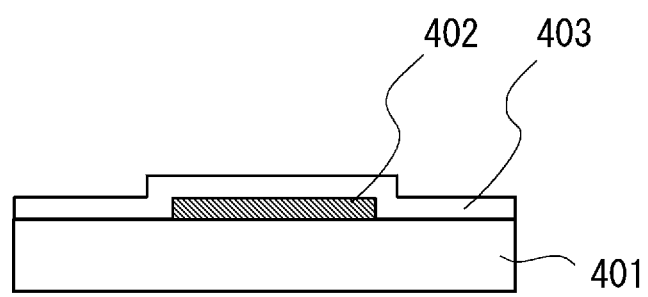
FIG. 16 is a process cross-sectional diagram showing processing of manufacturing the semiconductor device including the TFT according to the embodiment.
Figure 17:
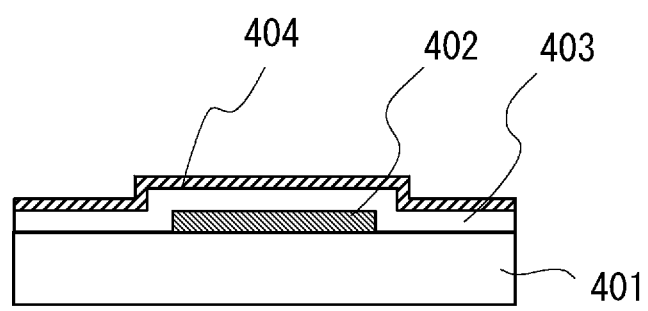
FIG. 17 is a process cross-sectional diagram showing processing of manufacturing the semiconductor device including the TFT according to the embodiment.

Next, as shown in FIG. 16, a gate insulating film 403 is formed on the gate electrode 402. The gate insulating film 403 is formed to cover the gate electrode 402. Then, as shown in FIG. 17, an amorphous silicon film 404 is formed on the gate insulating film 403. The amorphous silicon film 404 is disposed in such a way that it overlap the gate electrode 402 with the gate insulating film 403 interposed therebetween. In this way, the amorphous silicon film 404 is formed on the gate electrode.

The gate insulating film 403 is a silicon nitride film ($SiN_x$), a silicon oxide film ($SiO_2$ film), a layered film thereof, or the like. Specifically, the gate insulating film 403 and the amorphous silicon film 404 are consecutively formed by the Chemical Vapor Deposition (CVD) method. After that, the gate insulating film 403 and the amorphous silicon film 404 are patterned to thereby form island-shaped amorphous silicon films 404 at predetermined positions of the respective subpixels.

Figure 18:
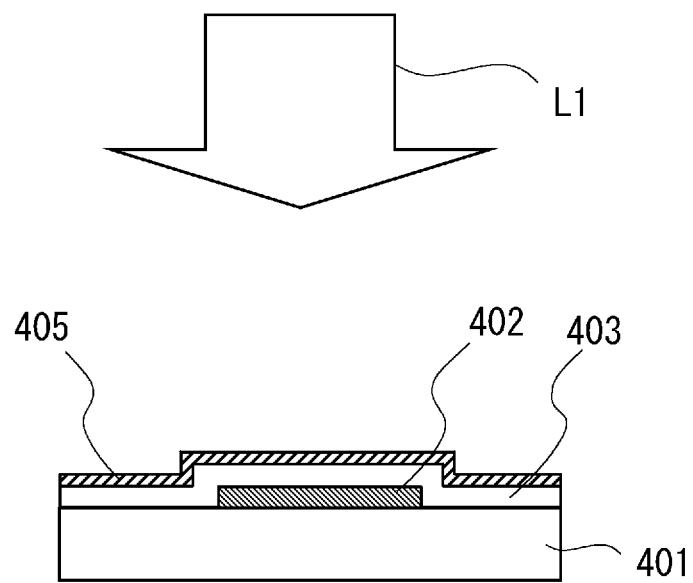
FIG. 18 is a process cross-sectional diagram showing processing of manufacturing the semiconductor device including the TFT according to the embodiment.

Then, the amorphous silicon film 404 is irradiated with the laser beam L1, so that a polysilicon film 405 is formed as shown in FIG. 18. That is, the amorphous silicon film 404 is polycrystallized by the laser irradiation device 70. As a result, the polysilicon film 405 in which silicon is polycrystallized is formed on the gate insulating film 403. The polysilicon film 405 corresponds to the above-described pSi film 14. Impurities may be introduced into the polysilicon film 405 by the ion implantation method or the like.

Figure 19:
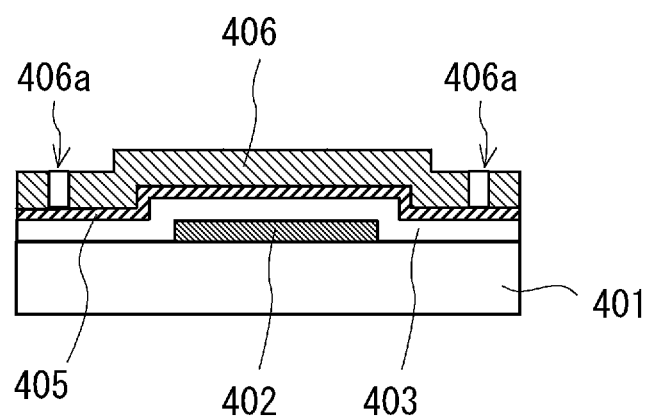
FIG. 19 is a process cross-sectional diagram showing processing of manufacturing the semiconductor device including the TFT according to the embodiment.

After that, as shown in FIG. 19, an interlayer insulating film 406 is formed on the polysilicon film 405. Contact holes 406a for exposing the polysilicon film 405 are provided in the interlayer insulating film 406.

The interlayer insulating film 406 is a silicon nitride film (SiN), a silicon oxide film ($SiO_2$ film), a layered film thereof, or the like. Specifically, the interlayer insulating film 406 is formed by the CVD method. Then, the interlayer insulating film 406 is patterned by the photolithography method to thereby form the contact holes 406a.

Figure 20:
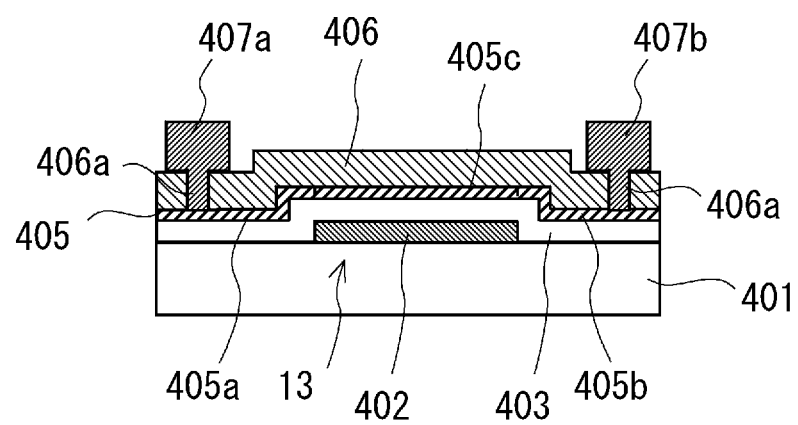
FIG. 20 is a process cross-sectional diagram showing processing of manufacturing the semiconductor device including the TFT according to the embodiment.

Next, as shown in FIG. 20, a source electrode 407a and a drain electrode 407b are formed on the interlayer insulating film 406. The source electrode 407a and the drain electrode 407b are formed to cover the contact holes 406a, respectively. That is, the source electrode 407a and the drain electrode 407b are formed from within the respective contact holes 406a to above the interlayer insulating film 406. Therefore, the source electrode 407a and the drain electrode 407b are electrically connected to the polysilicon film 405 through the contact holes 406 a.

As a result, the TFT 13 is formed. An area of the polysilicon film 405 overlapping the gate electrode 402 is a channel region 405c. An area of the polysilicon film 405 on the source electrode 407a side with respect to the channel region 405c is a source region 405a, and an area of the polysilicon film 405 on the drain electrode 407b side is a drain region 405b.

The source electrode 407a and the drain electrode 407b are formed of a metal thin film containing aluminum or the like. A metal thin film is formed on the interlayer insulating film 406 by the sputtering method or the evaporation method. Then, the metal thin film is patterned by the photolithography to thereby form the source electrode 407a and the drain electrode 407b.

Figure 21:
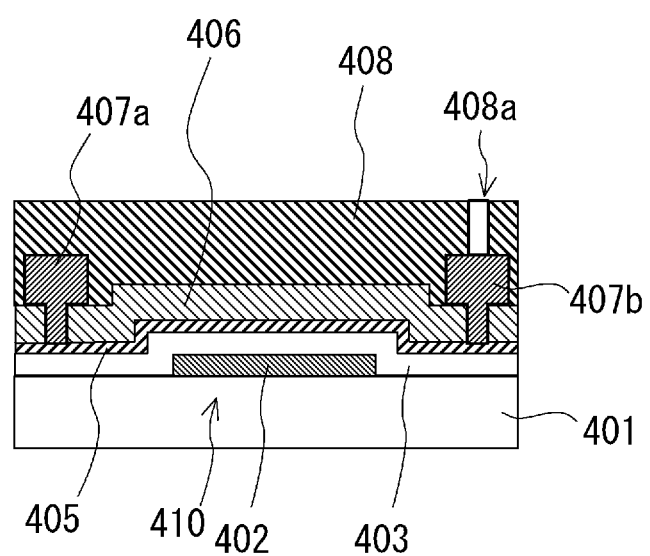
FIG. 21 is a process cross-sectional diagram showing processing of manufacturing the semiconductor device including the TFT according to the embodiment.

Then, as shown in FIG. 21, a planarization film 408 is formed on the source electrode 407a and the drain electrode 407b. The planarization film 408 is formed to cover the source electrode 407a and the drain electrode 407b. Further, a contact hole 408a for exposing the drain electrode 407b is provided in the planarization film 408.

The planarization film 408 is formed of, for example, a photosensitive resin film. A photosensitive resin film is applied to the source electrode 407a and the drain electrode 407b, and then exposed and developed. As a result, the planarization film 408 having the contact hole 408a can be patterned.

Figure 22:
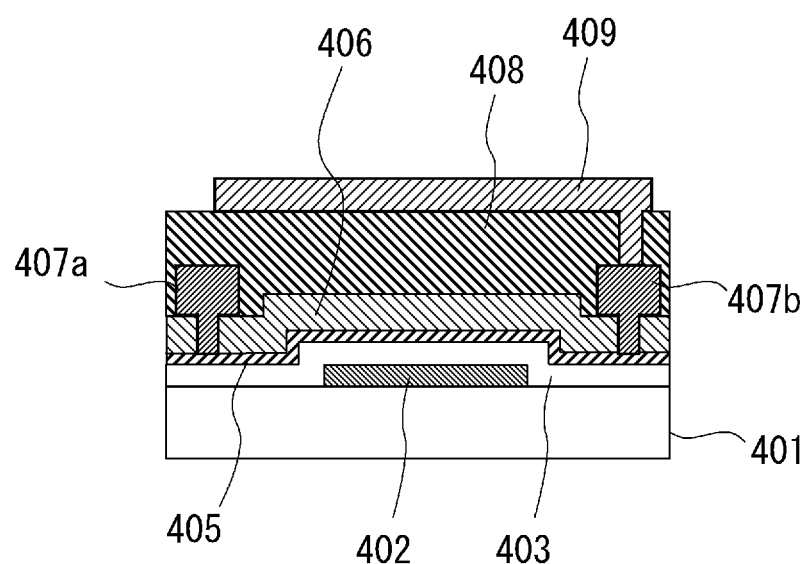
FIG. 22 is a process cross-sectional diagram showing processing of manufacturing the semiconductor device including the TFT according to the embodiment.

Then, as shown in FIG. 22, a pixel electrode 409 is formed on the planarization film 408. The pixel electrode 409 is formed to cover the contact hole 408a. That is, the pixel electrode 409 is formed from the inside of the contact hole 408a to above the planarization film 408. Therefore, the pixel electrode 409 is electrically connected to the drain electrode 407b through the contact hole 408a.

The pixel electrode 409 is formed of a transparent conductive film or a metal thin film containing aluminum or the like. A conductive film (a transparent conductive film or a metal thin film) is formed on the planarization film 408 by the sputtering method or the like. Then, the conductive film is patterned by the photolithography method. Consequently, the pixel electrode 409 is formed on the planarization film 408.

The manufacturing process of the inverted staggered TFT has been described. However, the manufacturing method according to this embodiment may be applied to manufacturing an inverted staggered TFT.

After that, the display 1 is manufactured by predetermined processing.

<LCD>

Figure 23:
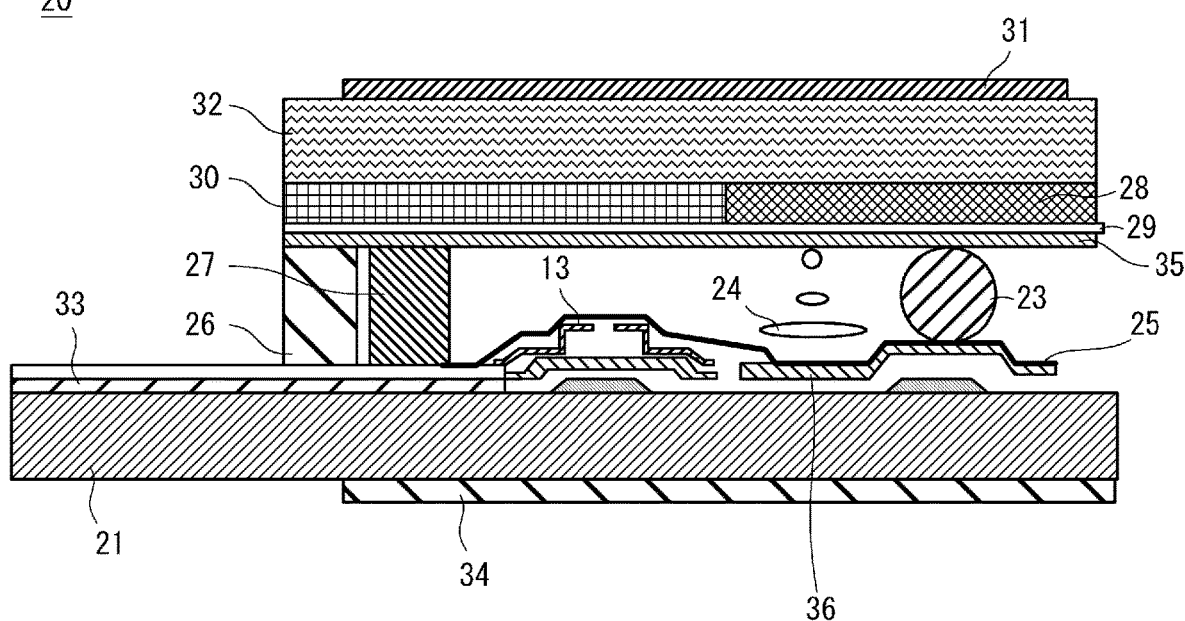
FIG. 23 is a cross-sectional diagram showing an example of an LCD panel used for a display according to an embodiment.

Next, an LCD panel will be described as an example of the display. FIG. 23 is a cross-sectional diagram showing an example of a LCD panel 20 used for the display according to the embodiment. As shown in FIG. 23, the LCD panel 20 includes an array substrate 21, a TFT 13, a spacer 23, a liquid crystal 24, an array substrate side alignment film 25, a short ring line 26, a sealing material 27, a color filter (CF) 28, a counter electrode 29, a black matrix 30, a front polarizing plate 31, a counter substrate 32, a bonding pad 33, a rear polarizing plate 34, and a CF substrate side alignment film 35.

FIG. 23 shows a transmissive LCD panel 20 that is disposed in such a way that the side of the counter substrate 32 is the front side and the array substrate 21 is disposed on the rear side. That is, a backlight unit (not shown) is disposed on the side of the array substrate 21. The user visually recognizes light from the backlight unit which has passed through the array substrate 21, the liquid crystal 24, and the counter substrate 32 in this order.

The array substrate 21 and the counter substrate 32 are arranged to face each other. The liquid crystal 24 is sandwiched between the array substrate 21 and the counter substrate 32. The array substrate 21 and the counter substrate 32 are bonded to each other using the sealing material 27 formed in a rectangular frame shape. That is, the liquid crystal 24 is sealed in a space formed by the liquid crystal 24, the counter substrate 32, and the sealing material 27. Further, the spacer 23 for defining a cell gap is disposed between the array substrate 21 and the counter substrate 32.

The TFT 13 constituting a pixel circuit is provided on the surface of the array substrate 21 facing the liquid crystal 24. The TFT 13 is connected to the pixel electrode 36. A display signal is supplied to the pixel electrode 36 through the TFT 13. The configuration of the pixel circuit will be described later. Further, the bonding pad 33 is provided on the array substrate 21. The bonding pad 33 is disposed outside the sealing material 27. Various signals and a common potential from an external drive circuit and are supplied through the bonding pad 33.

The black matrix 30, the color filter 28, and the counter electrode 29 are provided on the surface of the counter substrate 32 facing the liquid crystal 24. The color filter 28 is provided in each of the subpixels 12R to 12Y. The color filter 28 is formed of colored resin of R, G, B, and Y. The color filter 28 allows white light from the backlight unit to be converted into each RGBY color.

The black matrix 30 is formed in the areas between the subpixels 12R to 12Y and the peripheral part of the counter substrate 32. The black matrix 30 is made of black resin. The black matrix 30 is provided to prevent light leakage from the areas between the subpixels 12R to 12Y or the peripheral part of the counter substrate 32.

The counter electrode 29 is formed on almost the entire surface of the counter substrate 32. The counter electrode 29 is connected to the bonding pad 33 on the array substrate 21 by the short ring line 26. A common potential is supplied to the counter electrode 29 through the short ring line 26 and the bonding pad 33.

The array substrate side alignment film 25 is formed on an outermost surface of the array substrate 21 facing the liquid crystal 24. The CF substrate side alignment film 35 is formed on an outermost surface of the counter substrate 32 facing the liquid crystal 24. The liquid crystal 24 is oriented in a predetermined direction by the array substrate side alignment film 25 and the CF substrate side alignment film 35.

The rear polarizing plate 34 is provided on the surface of the array substrate 21 opposite to the liquid crystal 24. The front polarizing plate 31 is provided on the surface of the counter substrate 32 opposite to the liquid crystal 24. The rear polarizing plate 34 and the front polarizing plate 31 are polarizing films (polarizers) that allow light in a vibration direction along a transmission axis to be transmitted therethrough. Therefore, the light transmitted through the rear polarizing plate 34 or the front polarizing plate 31 becomes linear polarized light in the direction along the transmission axis.

The state of the liquid crystal 24 changes according to a potential difference between the pixel electrode 36 and the counter electrode 29. Since the liquid crystal 24 has refractive index anisotropy, a phase difference (retardation) due to birefringence is generated in the light transmitted through the liquid crystal 24. The phase difference changes according to the display signal supplied to the pixel electrode. The polarization state of the light transmitted through the liquid crystal 24 changes according to the phase difference. Therefore, the amount of transmitted light of each pixel PX can be controlled according to the display signal. As a result, a desired image can be displayed.

Figure 24:
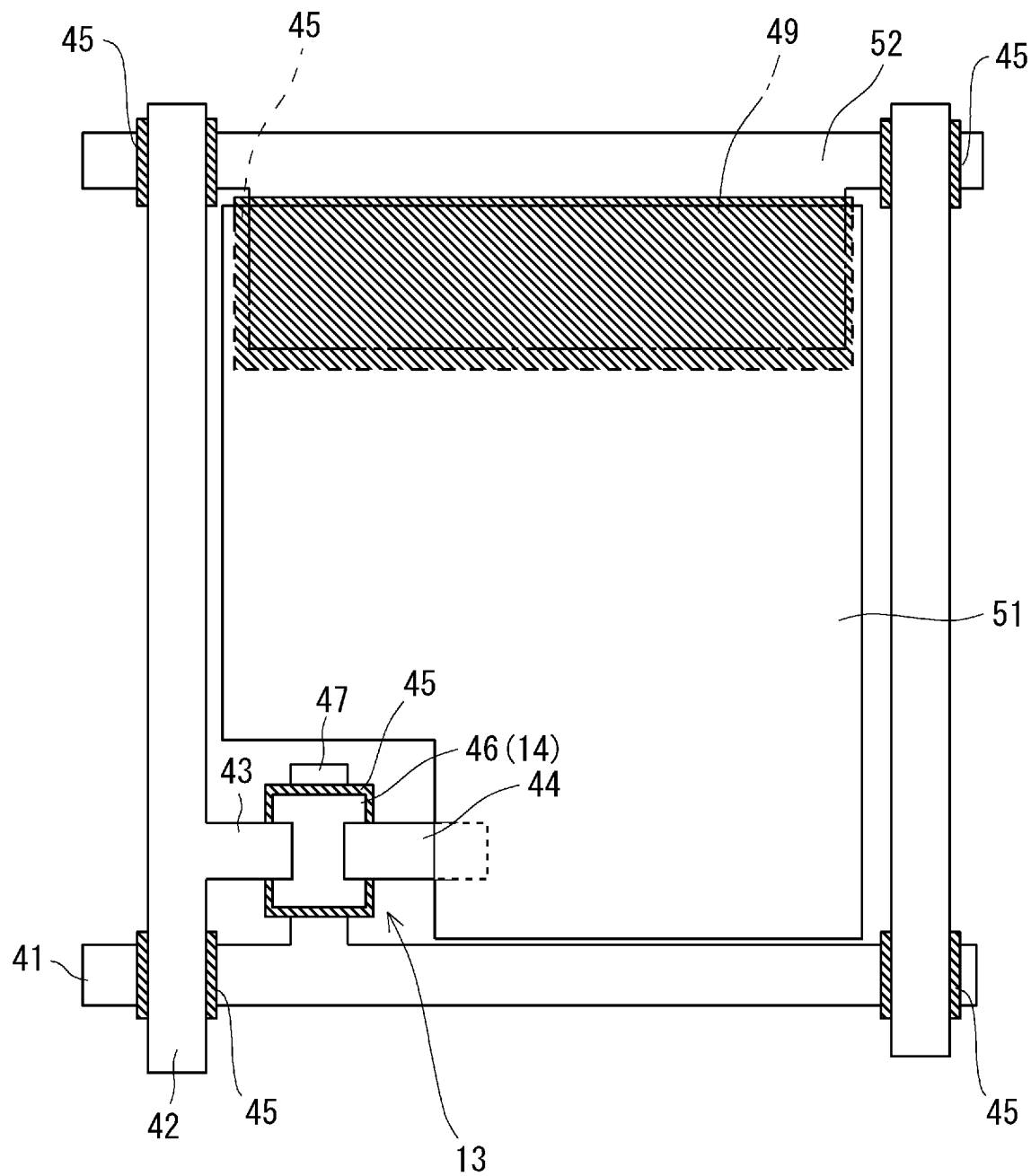
FIG. 24 is a plan view schematically showing a pixel circuit of a sub pixel.

Next, the pixel circuit of the subpixel 12R in the array substrate 21 will be described with reference to FIG. 24. The following description applies to the subpixels 12G, 12B and 12Y. FIG. 24 is a plan view schematically showing the pixel circuit of the subpixel 12R.

Gate lines 41 and storage capacitor lines 52 are provided along the X direction. Signal line 42 are provided along the Y direction. The gate lines 41 and the storage capacitor lines 52 are arranged in parallel with a predetermined spacing therebetween. The gate lines 41, the signal lines 42, and the storage capacitor lines 52 are formed of a metal thin film containing aluminum or the like. The gate lines 41, the signal lines 42, and the storage capacitor lines 52 are connected to an external drive circuit.

The gate lines 41 and the storage capacitor lines 52 are formed in the same layer. The signal lines 42 are formed above the gate lines 41 and the storage capacitor lines 52. Insulating films 45 for insulating the gate lines 41 from the signal lines 42 are provided at the intersections of the gate lines 41 and the signal lines 42. Likewise, insulating films 45 for insulating the storage capacitor lines 52 from the signal lines 42 are provided at the intersections of the storage capacitor lines 52 and the signal lines 42.

The TFTs 13 are provided in the vicinity of the intersections of the gate lines 41 and the signal lines 42. The TFT 13 includes a gate electrode 47, a source electrode 43, a drain electrode 44, a semiconductor layer 46, and the like. The semiconductor layer 46 is, for example, a pSi film 14.

The gate electrode 47 is extended in the +Y direction from the gate line 41. An insulating film 45 to be the gate insulating film is provided on the gate electrode 47. The rectangular semiconductor layer 46 is disposed on the insulating film 45. Therefore, the gate electrode 47 and the semiconductor layer 46 overlap each other with the insulating film 45 interposed therebetween.

The source electrode 43 is extended in the +X direction from the signal line 42 to above the semiconductor layer 46. An end of the source electrode 43 overlaps the semiconductor layer 46. A region of the semiconductor layer 46 right under the source electrode 43 is a source region.

The rectangular drain electrode 44 is disposed on the +X side of the source electrode 43. The drain electrode 44 is disposed apart from the source electrode 43. One end of the drain electrode 44 overlaps the semiconductor layer 46. In the semiconductor layer 46, a region right under the drain electrode 44 is a drain region. In the semiconductor layer 46, a region between the drain region and the source region is a channel region.

The other end of the drain electrode 44 overlaps a pixel electrode 51. The drain electrode 44 is connected to the pixel electrode 51 through a contact hole (not shown). The pixel electrode 51 is formed almost all over the subpixel 12R excluding the TFT 13. The pixel electrode 51 is formed of a transparent conductive film such as ITO.

Further, a storage capacitor electrode 49 is extended in the −Y direction from the storage capacitor line 52. The storage capacitor line 52 overlaps the pixel electrode 51 with the insulating film 45 interposed therebetween. As a result, a storage capacitor for holding a gradation voltage by a display signal is formed.

Next, an operation of the TFT 13 will be briefly described. A gate signal is supplied to the gate electrode 47 through the gate line 41. A display signal is supplied to the source electrode 43 through the signal line 42. A common potential is supplied to the storage capacitor line 52.

The gate signal supplied to the gate line 41 turns on the TFT 13. When the TFT 13 is turned on, the display signal is supplied to the pixel electrode 51 through the TFT 13. The liquid crystal 24 is driven by a potential difference (gradation voltage) between the pixel electrode 51 and the counter electrode.

As described above, in an active matrix display device, one TFT 13 is provided in one subpixel 12R. The TFT 13 of each subpixel 12R is provided with the semiconductor layer including the source region, the channel region, and the drain region. The pSi film 14 according to this embodiment is suitable for the semiconductor layer 46 of the TFT 13. That is, when the pSi film 14 of this embodiment is used for the semiconductor layer 46 of the TFT 13, the productivity can be improved and the grain size can be made uniform.

Next, effects of the present embodiment will be described.

In this embodiment, the relationship between the energy density of the laser beam and the grain size of the formed pSi film 14 is derived when the aSi film 18 provided on the substrate 11 is irradiated with the laser beam to thereby polycrystallize the aSi film 18 and form the pSi film 14. This enables the energy density of the laser beam to make the grain size of the pSi film 14 uniform to be used, thus improving the productivity and making the grain size uniform.

Further, as the energy density, the predetermined range of the energy density is selected from a range of the energy density in which the peak value in the lifetime measurement that is correlated with the grain size is greater than the maximum energy density, and a range of the energy density in which the change rate of the peak value normalized with the maximum value at different levels of the energy density is 5% or less. By doing so, a stable grain size can be achieved by a single irradiation. This expands the process margin, improves the productivity, and makes the grain size uniform.

Further, the predetermined range of the energy density is selected from the energy density range at which the grain size becomes the thickness of the pSi film 14 or less in the relationship between the energy density of the laser beam and the grain size. By doing so, a more stable grain size can be achieved by a single irradiation.

The greater the grain size of pSi, the greater the mobility of electrons, which is preferable. However, in order to increase the grain size of pSi, several irradiations using laser beams with low energy density are necessary. In order to increase the grain size of pSi and to increase the mobility of electrons, several laser irradiations are necessary, and thus the productivity is reduced. When the energy density is low, the energy width to be the optimum condition is small and the process margin is narrow.

On the other hand, in this embodiment, a laser beam with large energy density is used, so that the pSi film can be formed by a single laser beam irradiation. Therefore, the productivity can be improved. As described above, in this embodiment, an irradiation method is employed, which gives priority to the productivity achieved from requiring only one irradiation and the wide process margin of energy density while ensuring necessary mobility. This improves the productivity, reduces the production cost, and makes the grain size uniform.

As the displays can be manufactured under conditions with wide process margin, a laser apparatus having a high pulse fluctuation rate of laser beams can be used. Thus, the cost of the laser apparatus can be reduced. In particular, the number of laser irradiations greatly affects the productivity of the large-sized panels such as 8K televisions. Therefore, the method according to this embodiment is particularly advantageous in terms of the productivity of large-sized displays In the region with low energy density, a change in the grain size with respect to the change in energy density is large. Therefore, when the energy density is low, variation occurs. Furthermore, the variation in the respective irradiations increases when the laser beam is irradiated several times. On the other hand, in this embodiment, a laser beam with high energy density is used for the irradiation. In the region where the energy density is high, the change in the grain size with respect to the change in the energy density is small. Thus, variations in the grain size can be reduced.

The flat part 78a of the laser beam irradiates a part including the aSi film 18, and the steepness part 79a of the laser beam irradiates a part other than the aSi film 18 in the irradiation area. Therefore, the aSi film 18 is irradiated with the flat part 78a, so that the completely melt-crystallized pSi film 14c can be formed. This improves the productivity and uniforms the grain size.

A predetermined number of aSi films in the second area other than the first area are simultaneously irradiated after a predetermined number of aSi films in the first area are simultaneously irradiated. By doing so, the aSi film 18 is irradiated only once, thus improving the productivity.

Although the present disclosure made by the present inventors has been described in detail based on the embodiment above, it is obvious that the present disclosure is not limited to the embodiment described above, and various modifications may be made without departing from the scope of the present disclosure.

From the present disclosure thus described, it will be obvious that the embodiments of the present disclosure may be varied in many ways. Such variations are not to be regarded as a departure from the spirit and scope of the present disclosure, and all such modifications as would be obvious to one skilled in the art are intended for inclusion within the scope of the following claims.

What is claimed is:

1. A method of manufacturing a display comprising:
   (A) deriving a relationship between energy density of a laser beam and a grain size of a polysilicon film when the laser beam is applied to an amorphous silicon film provided on a substrate to thereby polycrystallize the amorphous silicon film and form the polysilicon film;
   (B) selecting a predetermined range of the energy density in the derived relationship; and
   (C) irradiating a first area including the amorphous silicon film with a laser beam at energy density in the selected range of the energy density to thereby polycrystallize the amorphous silicon film and form the polysilicon film,
   wherein, in the relationship, the predetermined range of the energy density is selected from a range of the energy density in which a peak value in lifetime measurement that is correlated with the grain size is greater than maximum energy density, and
   a range of the energy density in which a change rate of the peak value normalized with the maximum energy density at different levels of the energy density is 5% or less.

2. The method according to claim 1, wherein the predetermined range of the energy density is selected from a range of the energy density where the grain size becomes less than or equal to a thickness of the polysilicon film.

3. A method of manufacturing a display comprising:
   (A) deriving a relationship between energy density of a laser beam and a grain size of a polysilicon film when the laser beam is applied to an amorphous silicon film provided on a substrate to thereby polycrystallize the amorphous silicon film and form the polysilicon film;
   (B) selecting a predetermined range of the energy density in the derived relationship; and
   (C) irradiating a first area including the amorphous silicon film with a laser beam at energy density in the selected range of the energy density to thereby polycrystallize the amorphous silicon film and form the polysilicon film, wherein
   the first area includes the amorphous silicon film where a predetermined number of the polysilicon films are formed on the substrate on which a plurality of island-shaped polysilicon films are arranged in a matrix after the irradiation,
   the laser beam comprises:
      a flat part including a rectangular irradiation surface and showing a profile of the energy density within the selected range; and
      a steepness part including an irradiation surface formed on a periphery of the irradiation surface of the flat part and showing a profile that is other than the profile of the flat part and that decreases toward outside,
   the flat part irradiates a part of the first area including the amorphous silicon film, and
   the steepness part irradiates a part of the first area other than the amorphous silicon film.

4. The method according to claim 3, further comprising irradiating the amorphous silicon film in a second area other than the first area after irradiating the amorphous silicon film in the first area, wherein
   the plurality of the island-shaped polysilicon films are arranged in a matrix in one direction and another direction crossing the one direction,
   a spacing between the island-shaped polysilicon films that are next to each other in the one direction is smaller than a spacing between the plurality of the island-shaped polysilicon films that are next to each other in the other direction, and
   the second area is adjacent to the first area on the other direction side.

5. A method of manufacturing a display comprising:
   (A) deriving a relationship between energy density of a laser beam and a grain size of a polysilicon film when the laser beam is applied to an amorphous silicon film provided on a substrate to thereby polycrystallize the amorphous silicon film and form the polysilicon film;
   (B) selecting a predetermined range of the energy density in the derived relationship; and
   (C) irradiating a first area including the amorphous silicon film with a laser beam at energy density in the selected range of the energy density to thereby polycrystallize the amorphous silicon film and form the polysilicon film, wherein
   the first area includes a predetermined number of the amorphous silicon films on the substrate on which a plurality of the amorphous silicon films shaped in islands are arranged in a matrix,
   the laser beam comprises:
      a flat part including a rectangular irradiation surface and showing a profile of the energy density within the selected range; and
      a steepness part including an irradiation surface formed on a periphery of the irradiation surface of the flat part and showing a profile that is other than the profile of the flat part and that decreases toward outside,
   the flat part irradiates a part of the first area including the amorphous silicon films, and
   the steepness part irradiates a part of the first area other than the amorphous silicon films.

6. A method of manufacturing a display comprising:
   (a) irradiating a first area of a substrate on which a plurality of island-shaped amorphous silicon films are arranged in a matrix with a laser beam to thereby polycrystallize the amorphous silicon films and form polysilicon films, the first area including a predetermined number of the amorphous silicon films, wherein
   the laser beam comprises:
      a flat part including a rectangular irradiation surface and showing a profile of energy density within a selected range; and
      a steepness part including an irradiation surface formed on a periphery of the irradiation surface of the flat part and showing a profile that is other than the profile of the flat part and that decreases toward outside,
   the flat part irradiates a part of the first area including the amorphous silicon films, and
   the steepness part irradiates a part of the first area other than the amorphous silicon films.

7. The method according to claim 6, further comprising simultaneously irradiating the predetermined number of the amorphous silicon films in a second area other than the first area after the predetermined number of the amorphous silicon films in the first area are simultaneously irradiated.

8. The method according to claim 7, wherein
the plurality of island-shaped amorphous silicon films are arranged in a matrix in one direction and another direction crossing the one direction,
a spacing between the island-shaped amorphous silicon films that are next to each other in the one direction is smaller than a spacing between the plurality of island-shaped amorphous silicon films that are next to each other in the other direction, and
the second area is adjacent to the first area on the other direction side.

9. A method of manufacturing a display in which a plurality of thin film transistors, each including a polysilicon film, are arranged in a matrix, the method comprising:
(I) deriving a relationship between energy density of a laser beam that irradiates an amorphous silicon film and an average grain size of the polysilicon films formed from the amorphous silicon film;
(II) selecting first energy density of a first laser beam based on the relationship derived in (I); and
(III) irradiating the amorphous silicon film in a first area on a substrate with the first laser beam to form the polysilicon film,
wherein a plurality of areas are provided on the substrate,
at least one marker having a cross shape is provided on the substrate, and
each of the areas are irradiated with reference to the marker, and
wherein
a plurality of areas are provided on the substrate, and
the substrate further comprises a mask covering an area other than an area irradiated with the laser beam.

10. The method according to claim 9, wherein the first laser beam irradiates the first area only once.

11. The method according to claim 9, wherein the first laser beam irradiates the first area a plurality of times.

12. The method according to claim 9, wherein
areas other than areas already irradiated with the laser beam are sequentially irradiated.

13. A method of manufacturing a display in which a plurality of thin film transistors, each including a polysilicon film, are arranged in a matrix, the method comprising:
(I) deriving a relationship between energy density of a laser beam that irradiates an amorphous silicon film and an average grain size of the polysilicon films formed from the amorphous silicon film;
(II) selecting first energy density of a first laser beam based on the relationship derived in (I); and
(III) irradiating the amorphous silicon film in a first area on a substrate with the first laser beam to form the polysilicon film, wherein when the amorphous silicon film is polycrystallized, the entire amorphous silicon in a thickness direction is melted,
a plurality of areas are provided on the substrate, and
the substrate further comprises a mask covering an area other than an area irradiated with the laser beam.

14. A method of manufacturing a display in which a plurality of thin film transistors, each including a polysilicon film, are arranged in a matrix, the method comprising:
(I) deriving a relationship between energy density of a laser beam that irradiates an amorphous silicon film and an average grain size of the polysilicon films formed from the amorphous silicon film;
(II) selecting first energy density of a first laser beam based on the relationship derived in (I); and
(III) irradiating the amorphous silicon film in a first area on a substrate with the first laser beam to form the polysilicon film, wherein when the amorphous silicon film is polycrystallized, the entire amorphous silicon in a thickness direction is melted, and
the polysilicon film with a grain size being less than or equal to a thickness of the polysilicon film is formed,
wherein a glass substrate with a softening point of 700° C. or less is used for the substrate.

15. A method of manufacturing a display in which a plurality of thin film transistors, each including a polysilicon film, are arranged in a matrix, the method comprising:
(I) deriving a relationship between energy density of a laser beam that irradiates an amorphous silicon film and an average grain size of the polysilicon films formed from the amorphous silicon film;
(II) selecting first energy density of a first laser beam based on the relationship derived in (I); and
(III) irradiating the amorphous silicon film in a first area on a substrate with the first laser beam to form the polysilicon film, wherein when the amorphous silicon film is polycrystallized, the entire amorphous silicon in a thickness direction is melted,
wherein a glass substrate with a softening point of 700° C. or less is used for the substrate.

16. A method of manufacturing a display in which a plurality of thin film transistors, each including a polysilicon film, are arranged in a matrix, the method comprising:
(I) deriving a relationship between energy density of a laser beam that irradiates an amorphous silicon film and an average grain size of the polysilicon films formed from the amorphous silicon film;
(II) selecting first energy density of a first laser beam based on the relationship derived in (I); and
(III) irradiating the amorphous silicon film in a first area on a substrate with the first laser beam to form the polysilicon film, wherein when the amorphous silicon film is polycrystallized, the entire amorphous silicon in a thickness direction is melted,
the energy density is 400 mJ/cm$^2$ or greater,
a thickness of the polysilicon film is 50 nm or greater, and
a grain size of the polysilicon film is 50 nm or less,
wherein a glass substrate with a softening point of 700° C. or less is used for the substrate.

17. A display comprising:
a plurality of island-shaped polysilicon films arranged in a matrix on a substrate; and
a plurality of thin film transistors, each being formed on a respective one of the polysilicon films, wherein
a grain size of each polysilicon film is less than or equal to a thickness of said polysilicon film,
wherein the substrate is a glass substrate with a softening point of 700° C. or less,
the thickness of the polysilicon film is 50 nm or greater,
the grain size is 50 nm or less, and
the mobility of the polysilicon film is 5 to 10 cm$^2$/Vs.

18. The display according to claim 17, wherein different crystal grain boundaries cross crystal grain boundaries reaching from an interface with the substrate of the polysilicon film to a surface of the polysilicon film.

19. A liquid crystal television comprising the display according to claim 17.

\* \* \* \* \*